(12) United States Patent
Takagi et al.

(10) Patent No.: US 6,335,667 B1
(45) Date of Patent: Jan. 1, 2002

(54) MULTI-LONGITUDINAL MODE COUPLED SAW FILTER

(75) Inventors: Michiaki Takagi; Satoru Hayashi; Takashi Yamazaki, all of Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/529,357

(22) PCT Filed: Aug. 23, 1999

(86) PCT No.: PCT/JP99/04540

§ 371 Date: Apr. 13, 2000

§ 102(e) Date: Apr. 13, 2000

(87) PCT Pub. No.: WO00/13316

PCT Pub. Date: Mar. 9, 2000

(30) Foreign Application Priority Data

Aug. 28, 1998 (JP) ............................... 10-243836
Mar. 11, 1999 (JP) ............................... 11-065224

(51) Int. Cl.[7] ................................. H03H 9/64
(52) U.S. Cl. ................... 333/195; 333/196; 310/313 C; 310/313 D
(58) Field of Search ................... 333/193–196; 310/313 R, 313 B, 313 C, 313 D

(56) References Cited

U.S. PATENT DOCUMENTS

| 3,886,504 A | 5/1975 | Hartmann et al. | 333/195 |
| 4,454,488 A | 6/1984 | Hartmann | 333/195 |
| 4,731,595 A | 3/1988 | Wright | 333/195 |
| 5,392,013 A | 2/1995 | Yamamoto et al. | 333/195 |

FOREIGN PATENT DOCUMENTS

| JP | 60-264110 A | 12/1985 | ................. 333/193 |
| JP | 61-285814 A | 12/1986 | |
| JP | 62-200814 A | 9/1987 | ............. 310/313 R |
| JP | 1-212015 A | 8/1989 | |
| JP | 1-231417 A | 9/1989 | |
| JP | 3-80709 A | 4/1991 | ................. 333/193 |
| JP | 5-3169 B2 | 1/1993 | |
| JP | 6-177703 A | 6/1994 | ................. 333/193 |
| JP | 8-204502 A | 8/1996 | |
| JP | 10-93384 A | 4/1998 | |

OTHER PUBLICATIONS

E.J Staples et al., "Saw Resonator and Coupled Resonator Filters", Proceedings of the 30th Annual Symposium on Frequency Control, U.S. Army Electronics Command, pp. 322–327, Jun., 1976.

Primary Examiner—Robert Pascal
Assistant Examiner—Barbara Summons
(74) Attorney, Agent, or Firm—Oliff & Berridge, PLC

(57) ABSTRACT

A multi-longitudinal-mode-coupled resonator type SAW filter having flat passband characteristic is provided. In the multi-longitudinal-mode-coupled resonator type SAW filter, an energy trapped type SAW resonator is formed on a frequency upward type piezoelectric substrate, and an IDT is divided into three IDTs, a first IDT arranged to a transmitter side, a second IDT arranged to a receiver side, and a third IDT arranged between the first IDT and the second IDT to control the amplitude of the vibration displacement in two modes for forming a filter. A frequency potential is optimized by changing an electrode period length of each IDT. Resonance amplitude strengths in the two modes are thus equalized and passband transmission characteristics are thus flattened. A filter having a relatively wide bandwidth of 1000 to 1500 ppm is fabricated by using a substrate having a small electromechanical coupling factor, such as a quartz crystal substrate.

13 Claims, 21 Drawing Sheets

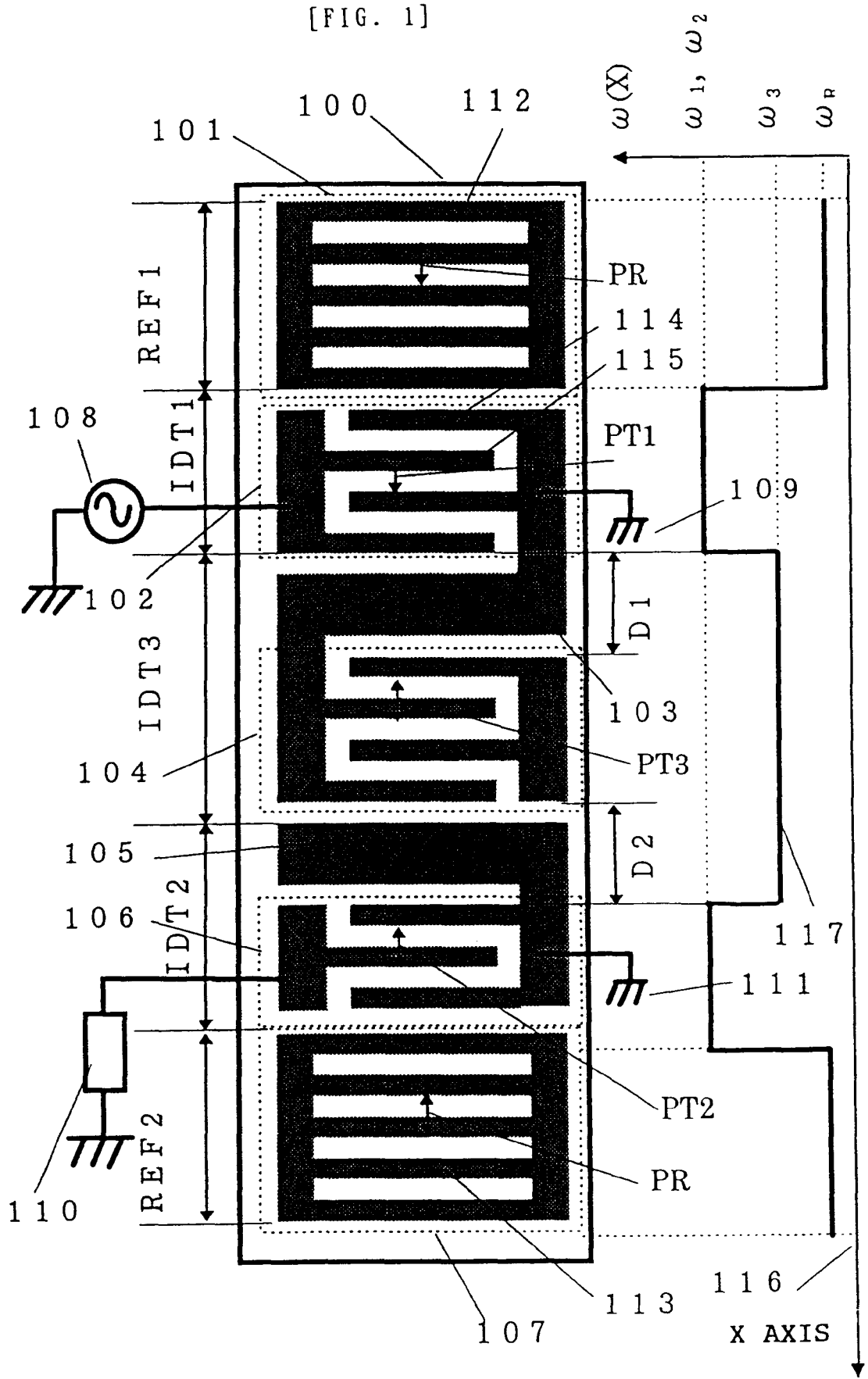

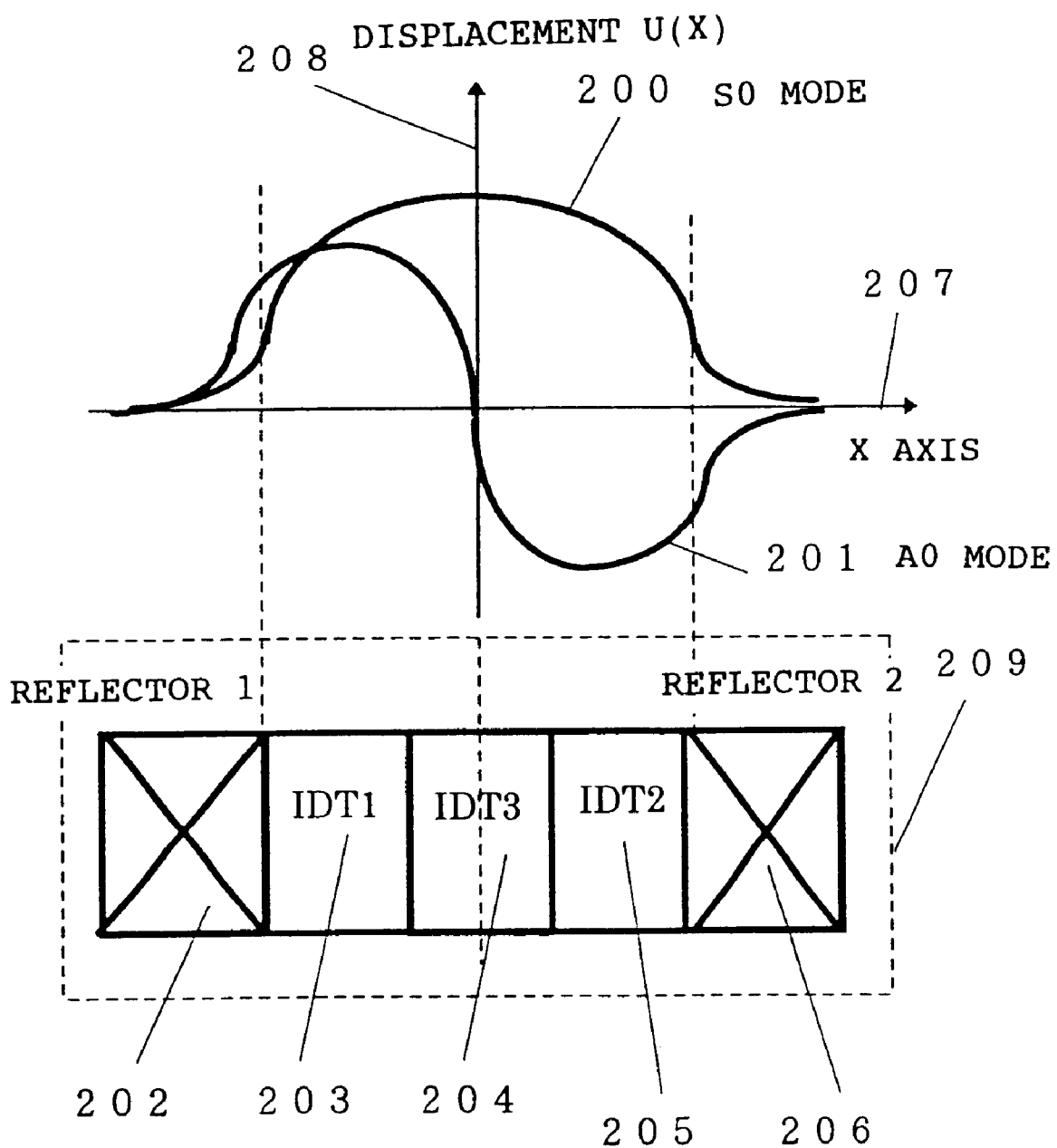
[FIG. 2]

[FIG. 3]
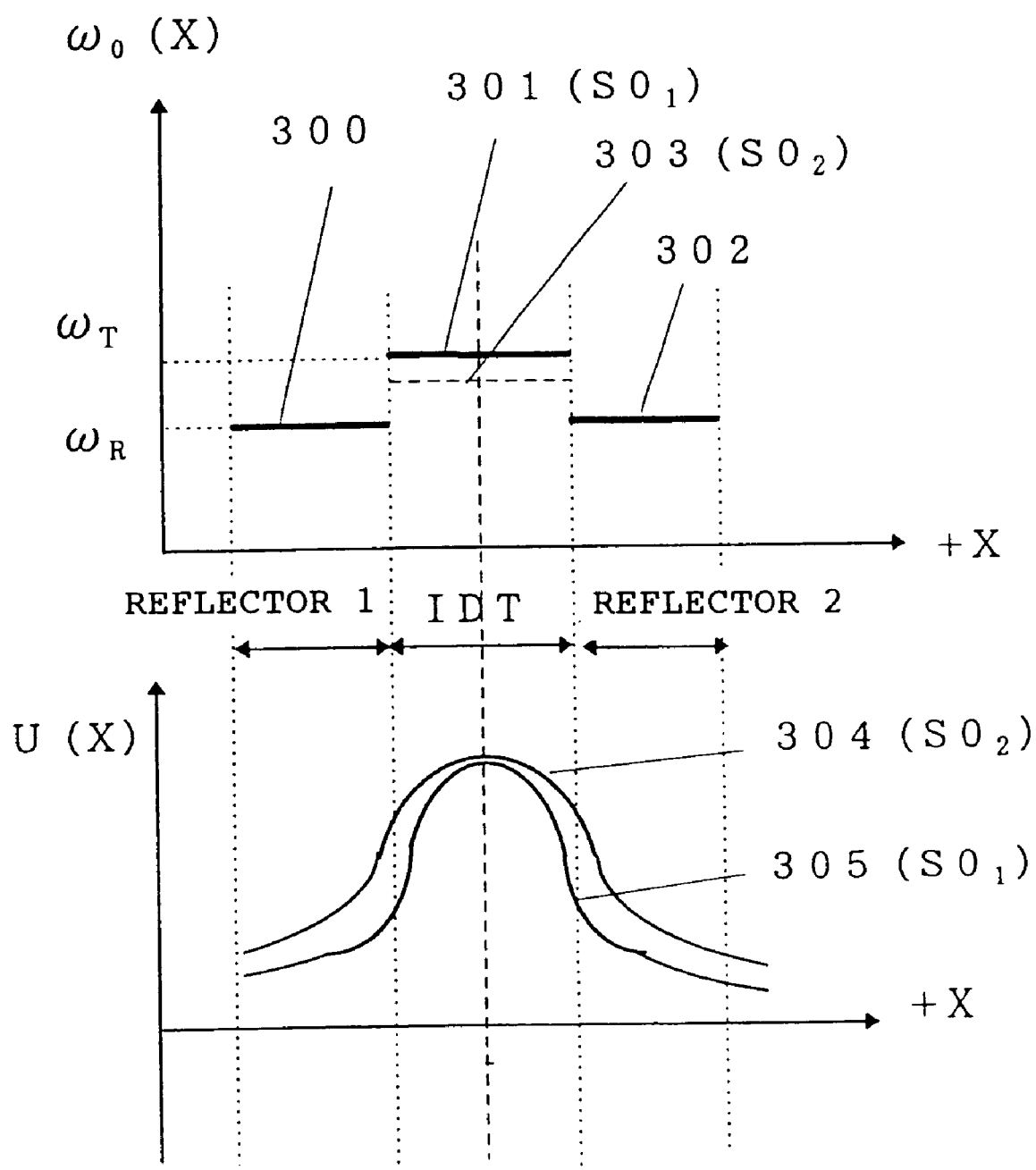

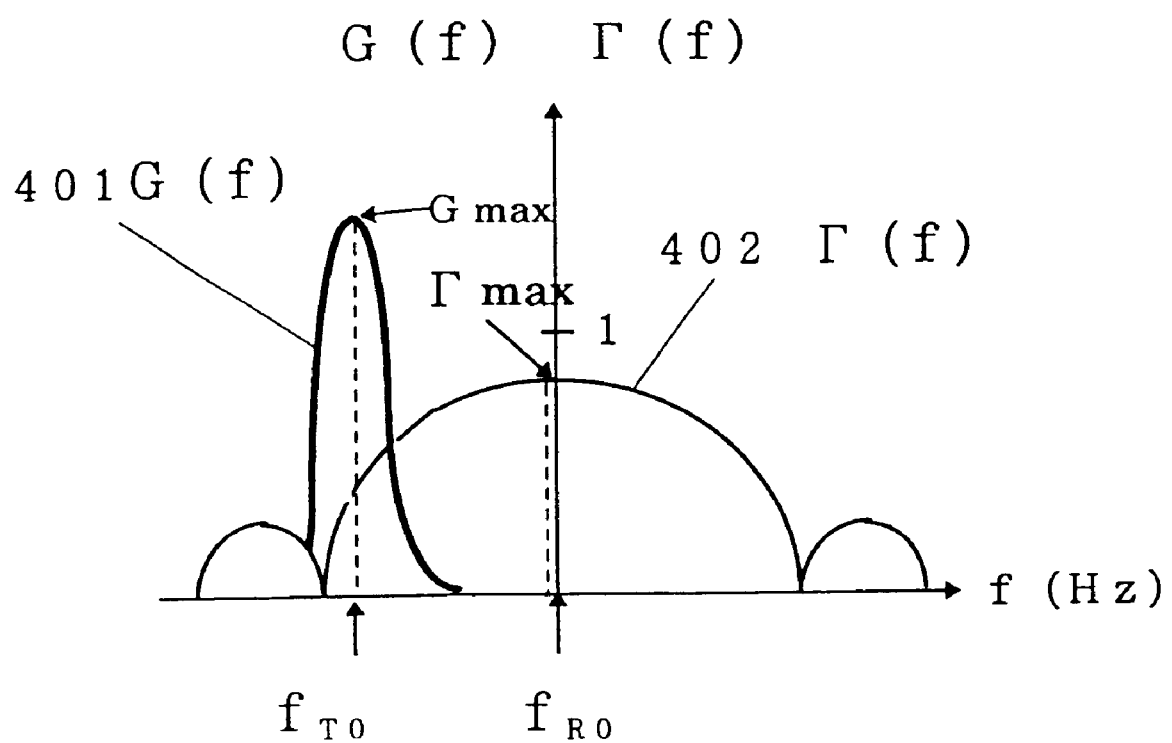
[FIG. 4]

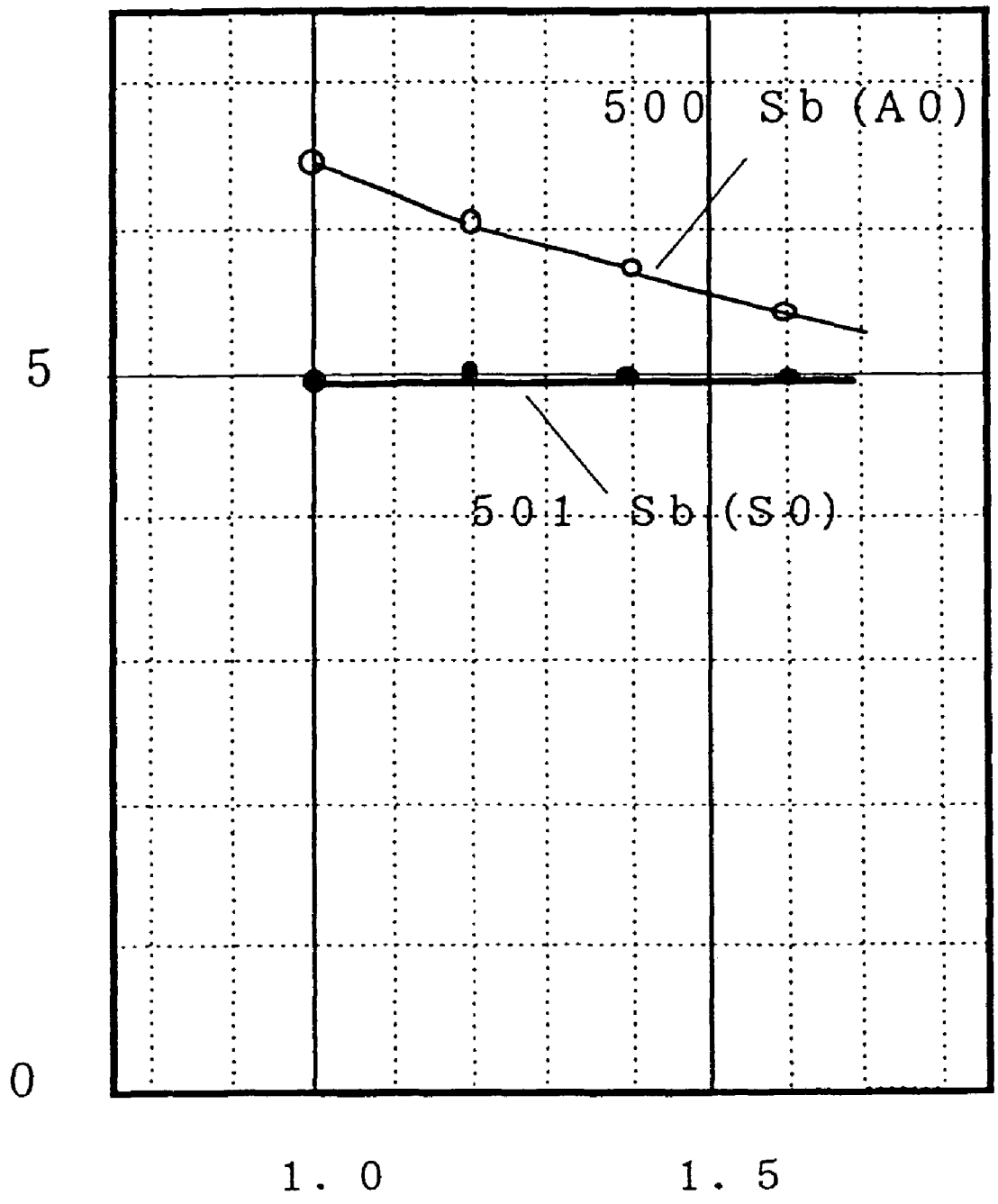
[FIG. 5]

[FIG. 6]
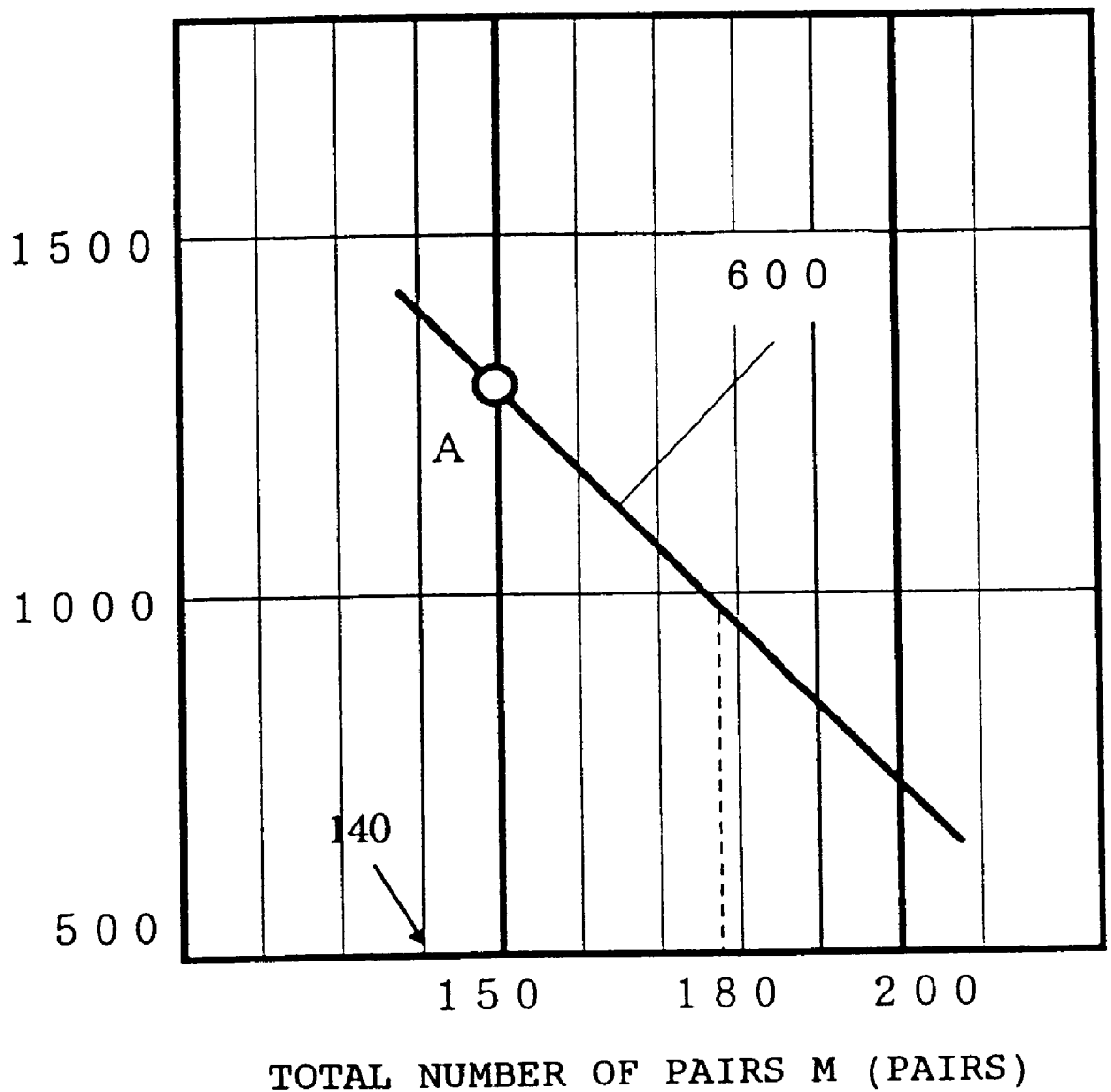

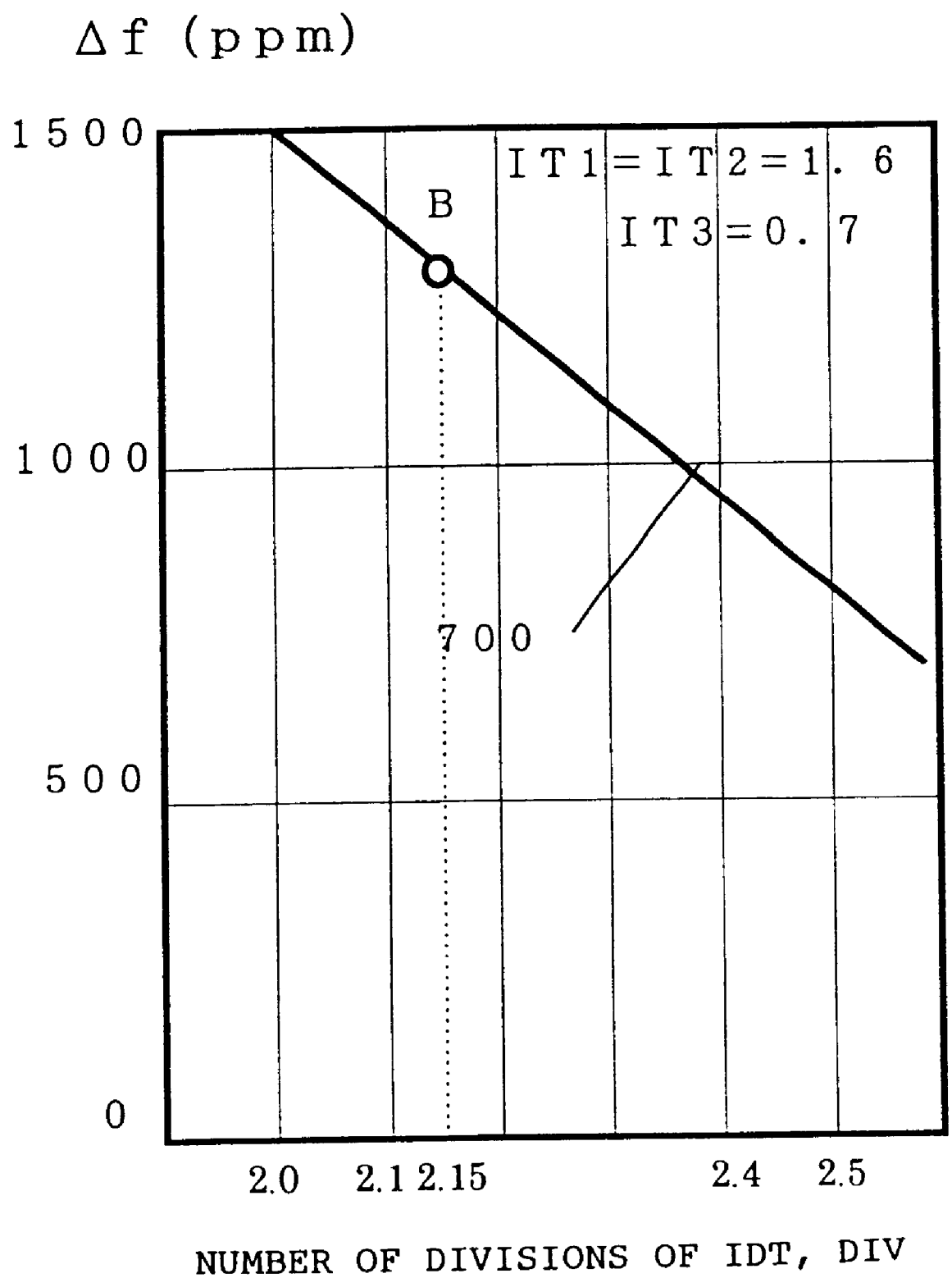
[FIG. 7]

[FIG. 8]
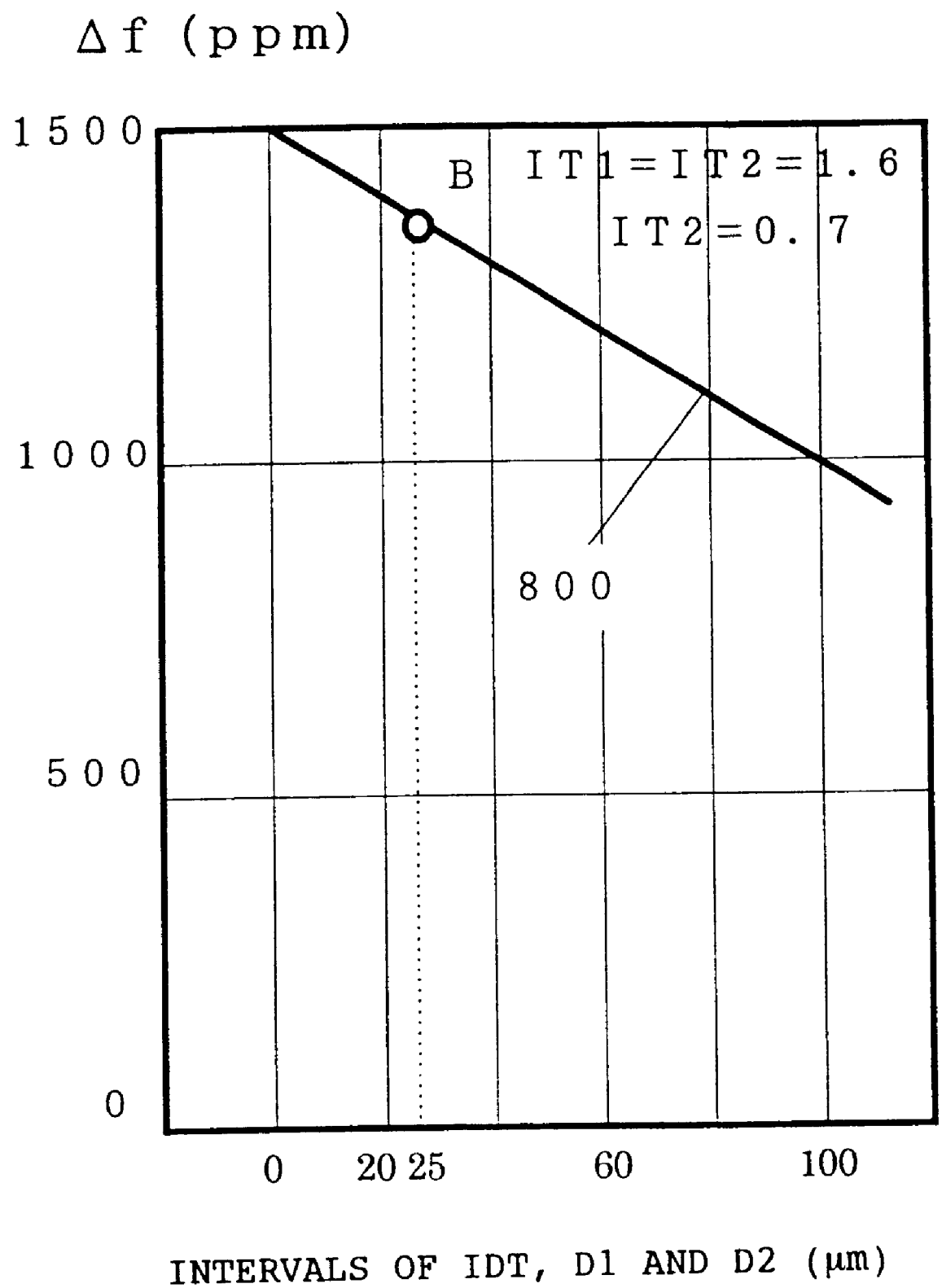

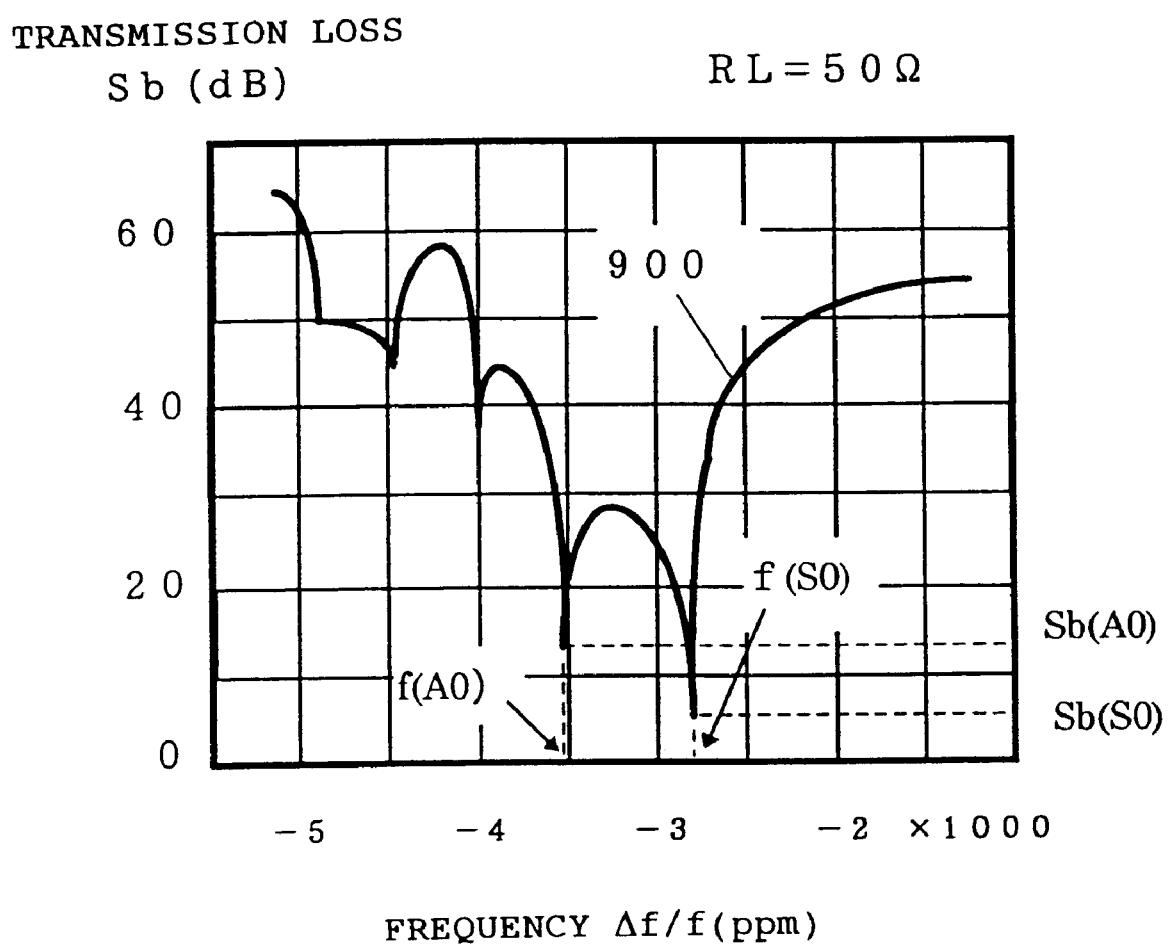
[FIG.9]

[FIG. 10]
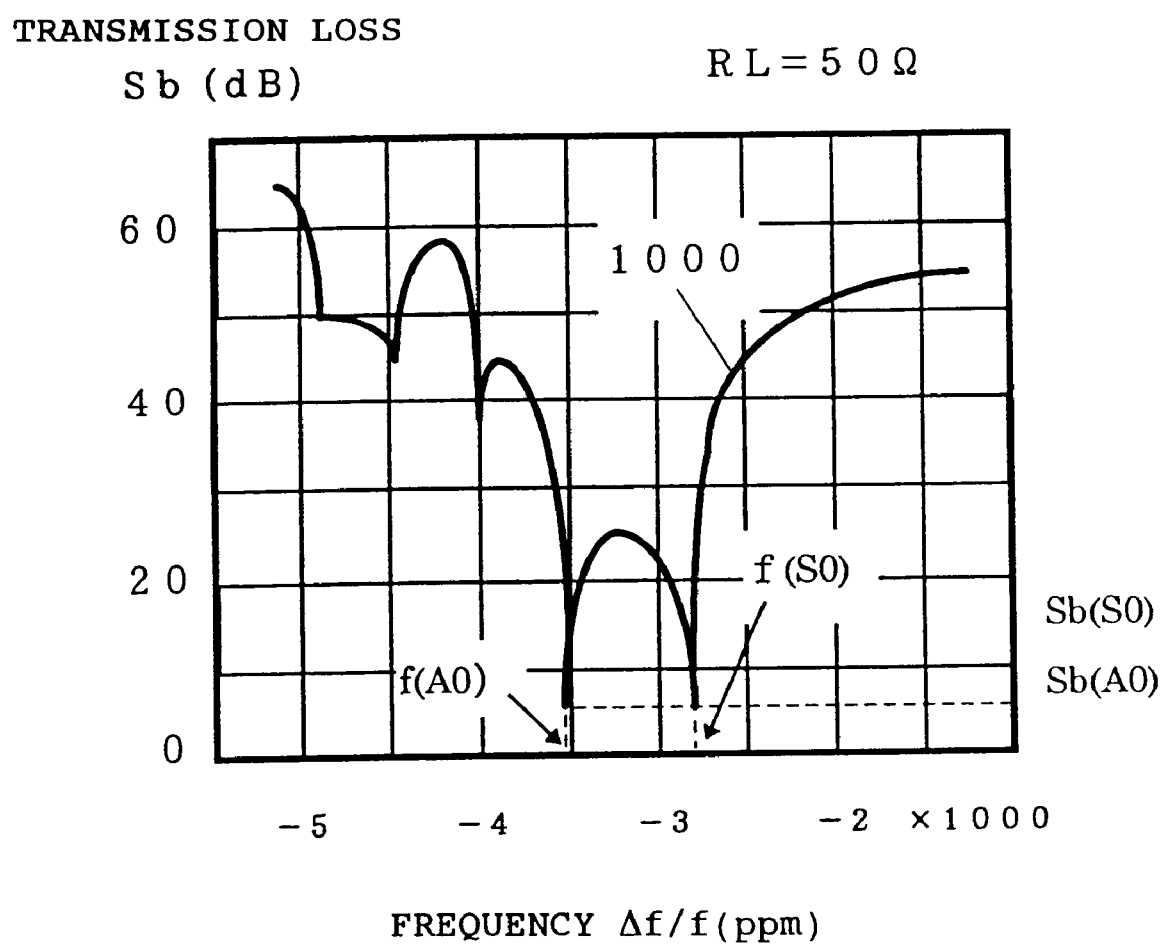

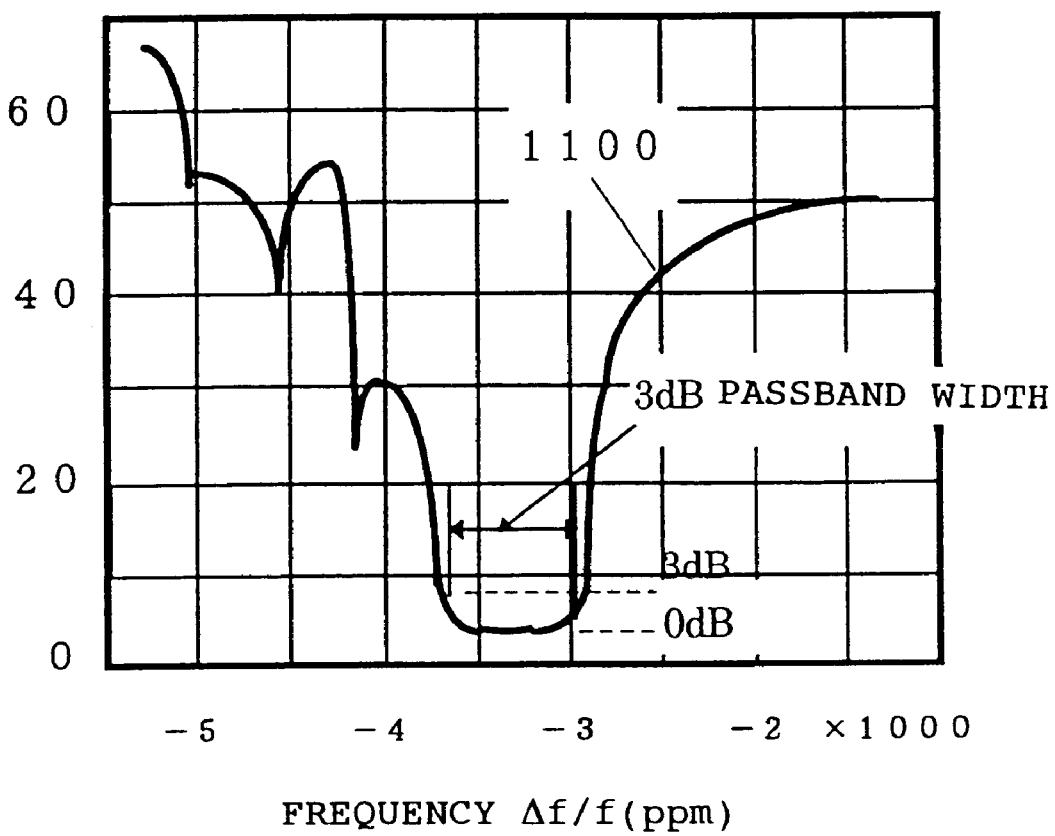
[FIG. 11]

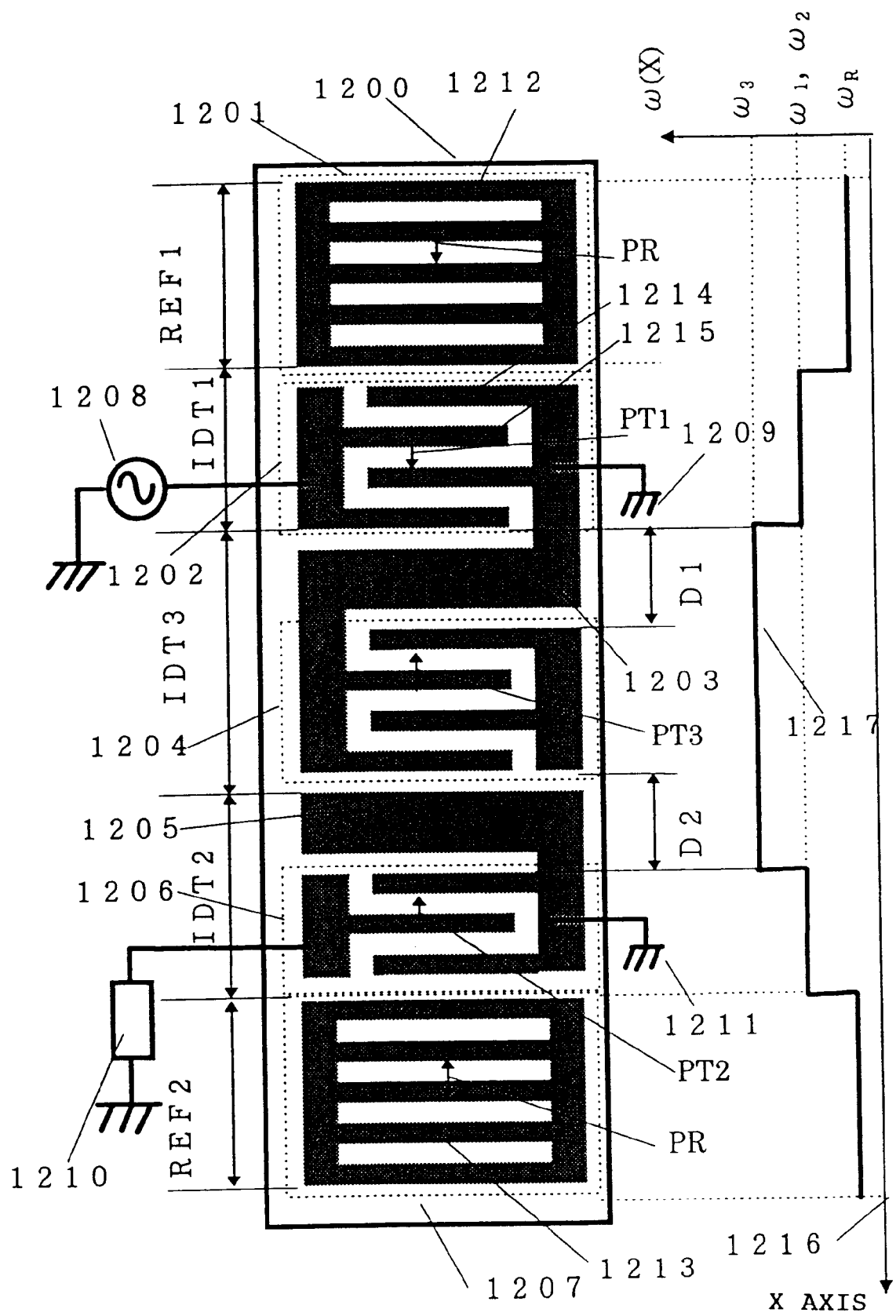
[FIG. 12]

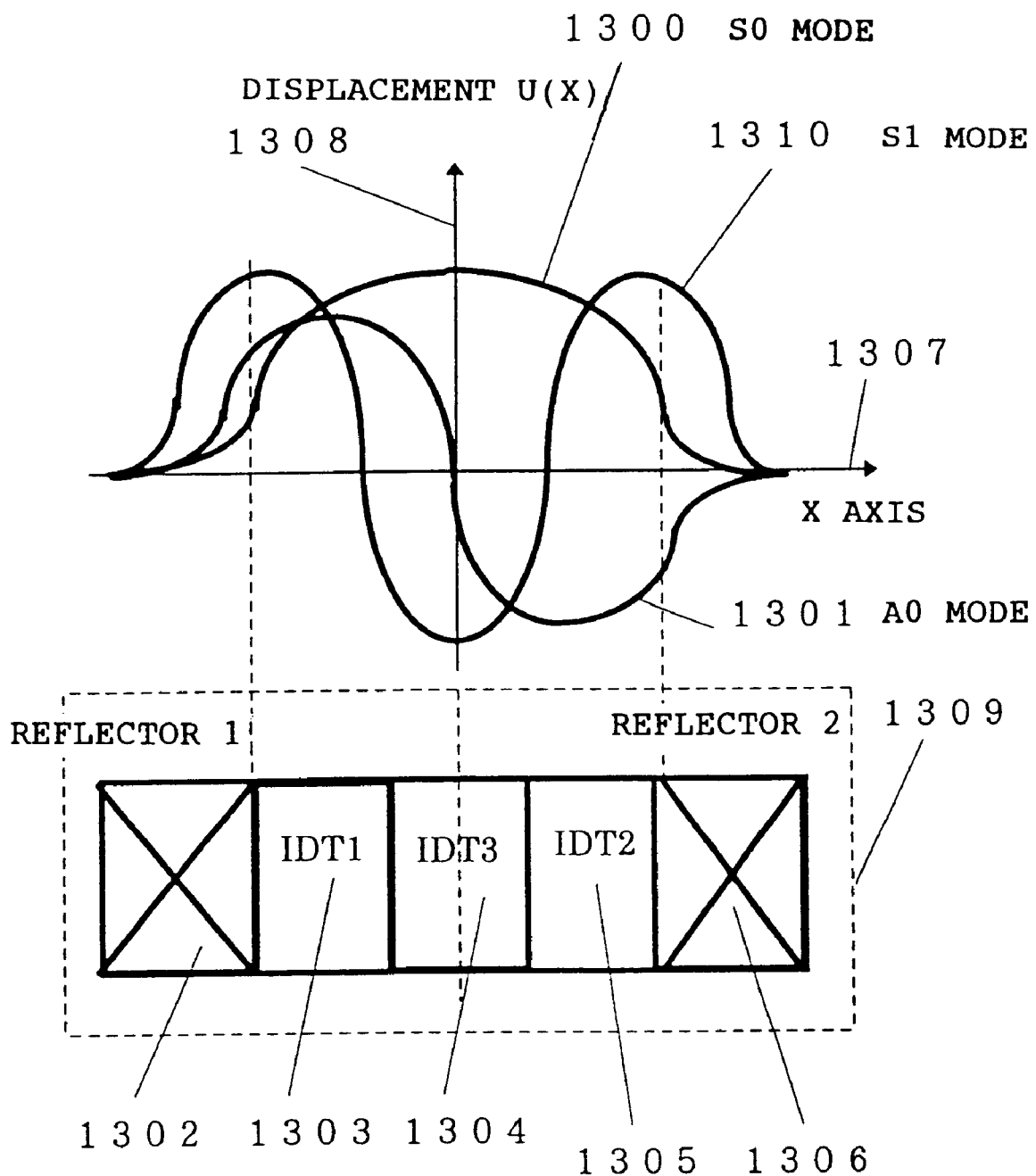
[FIG. 13]

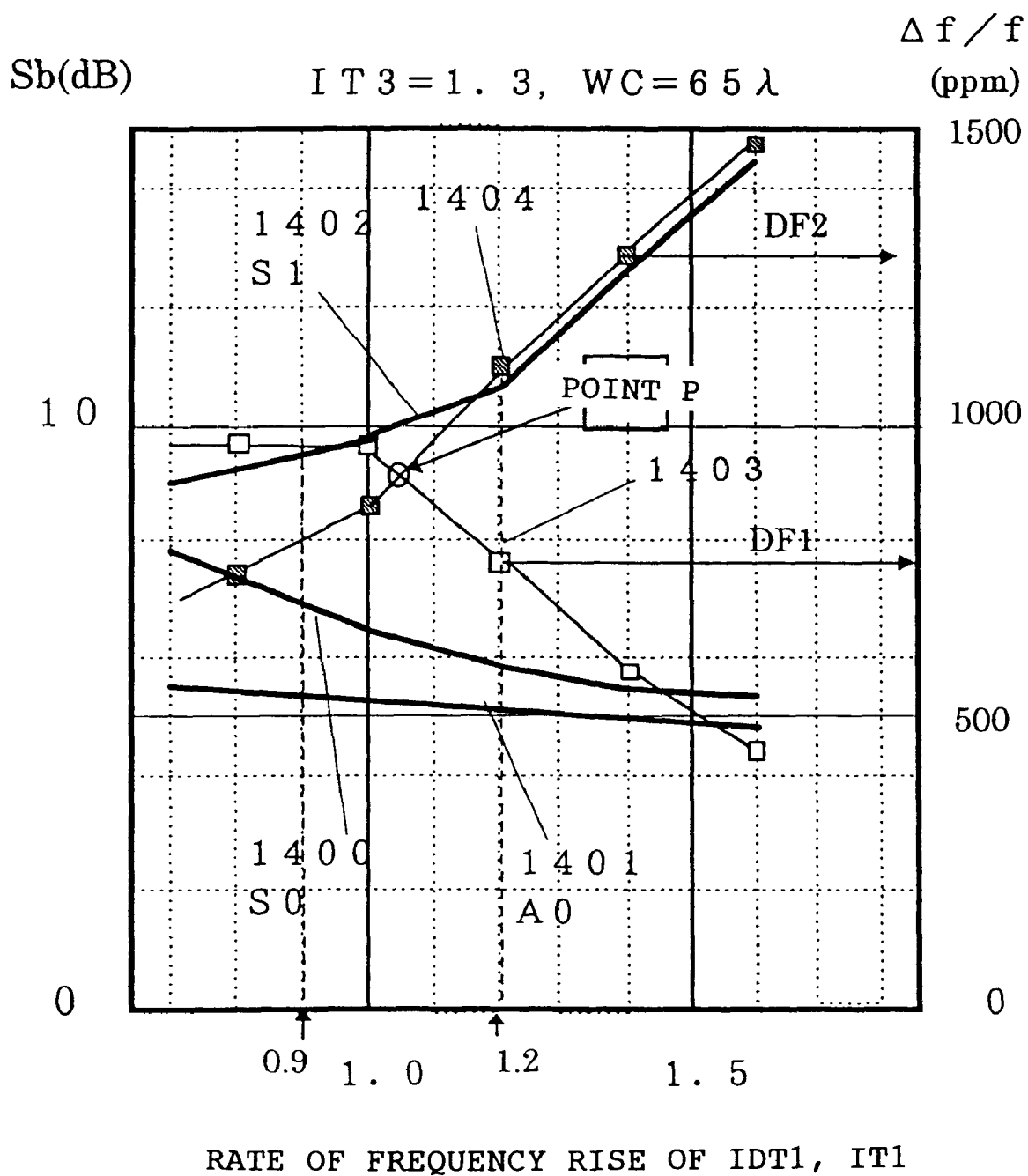
[FIG. 14]

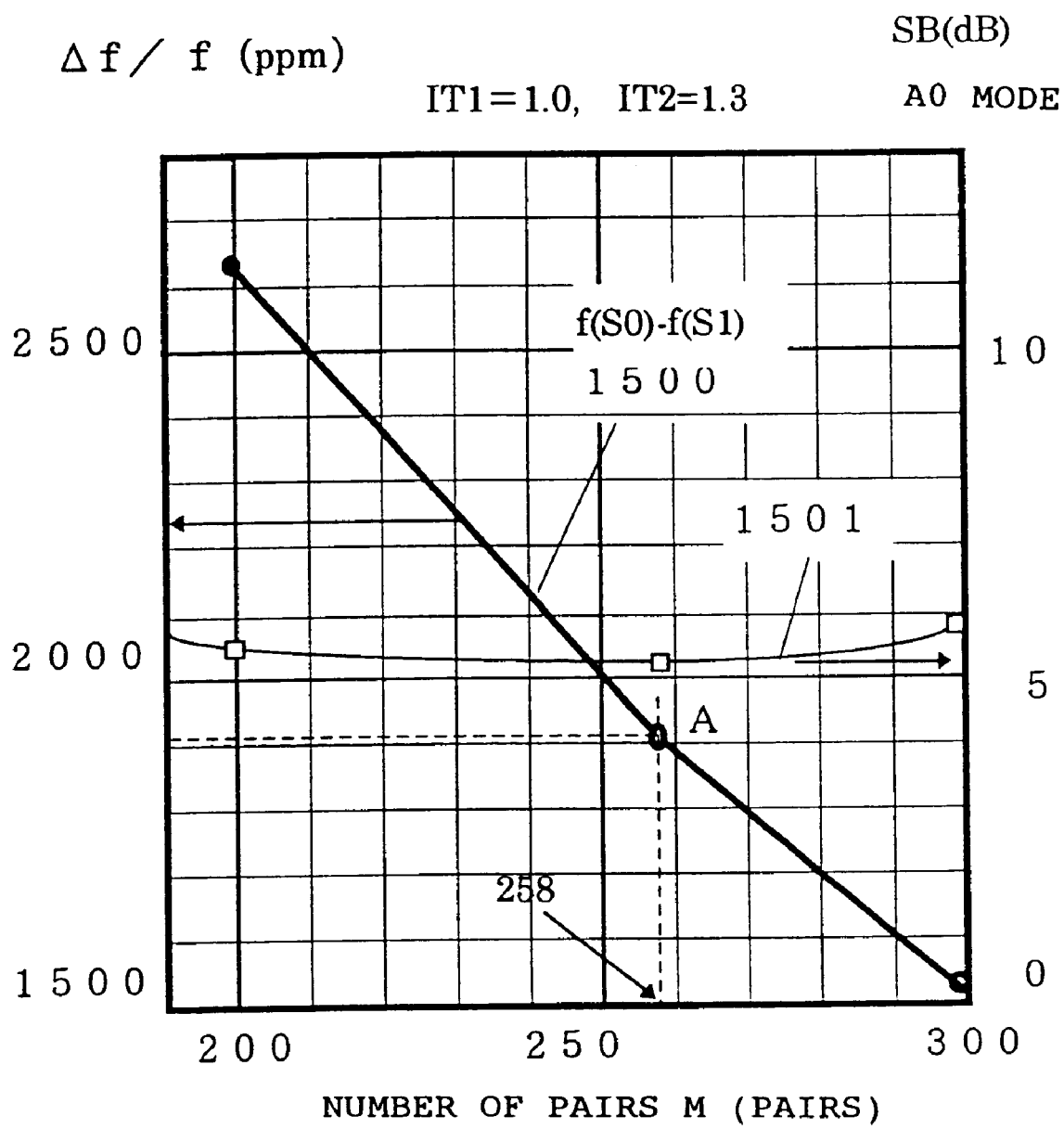
[FIG. 15]

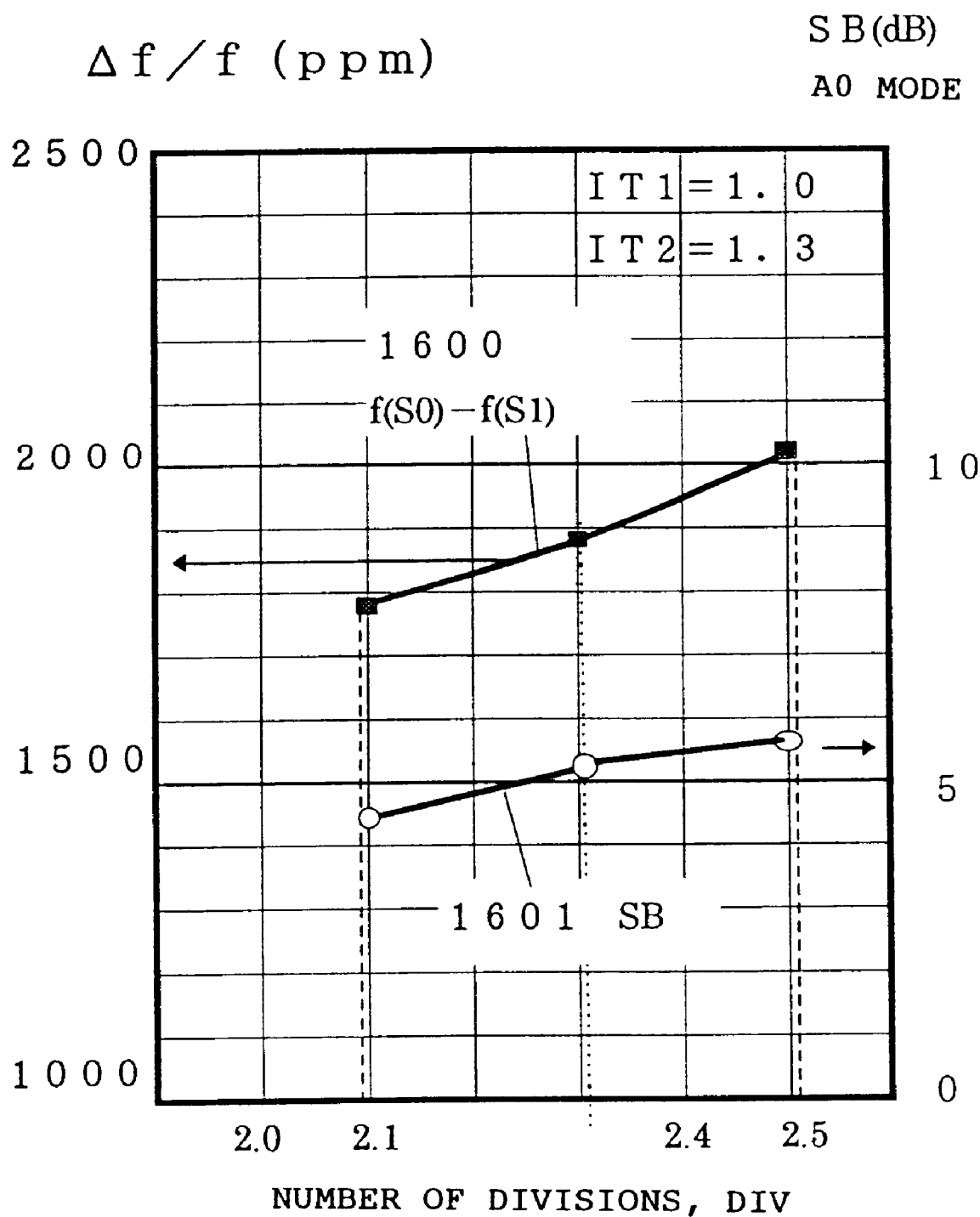
[FIG. 16]

[FIG. 17]
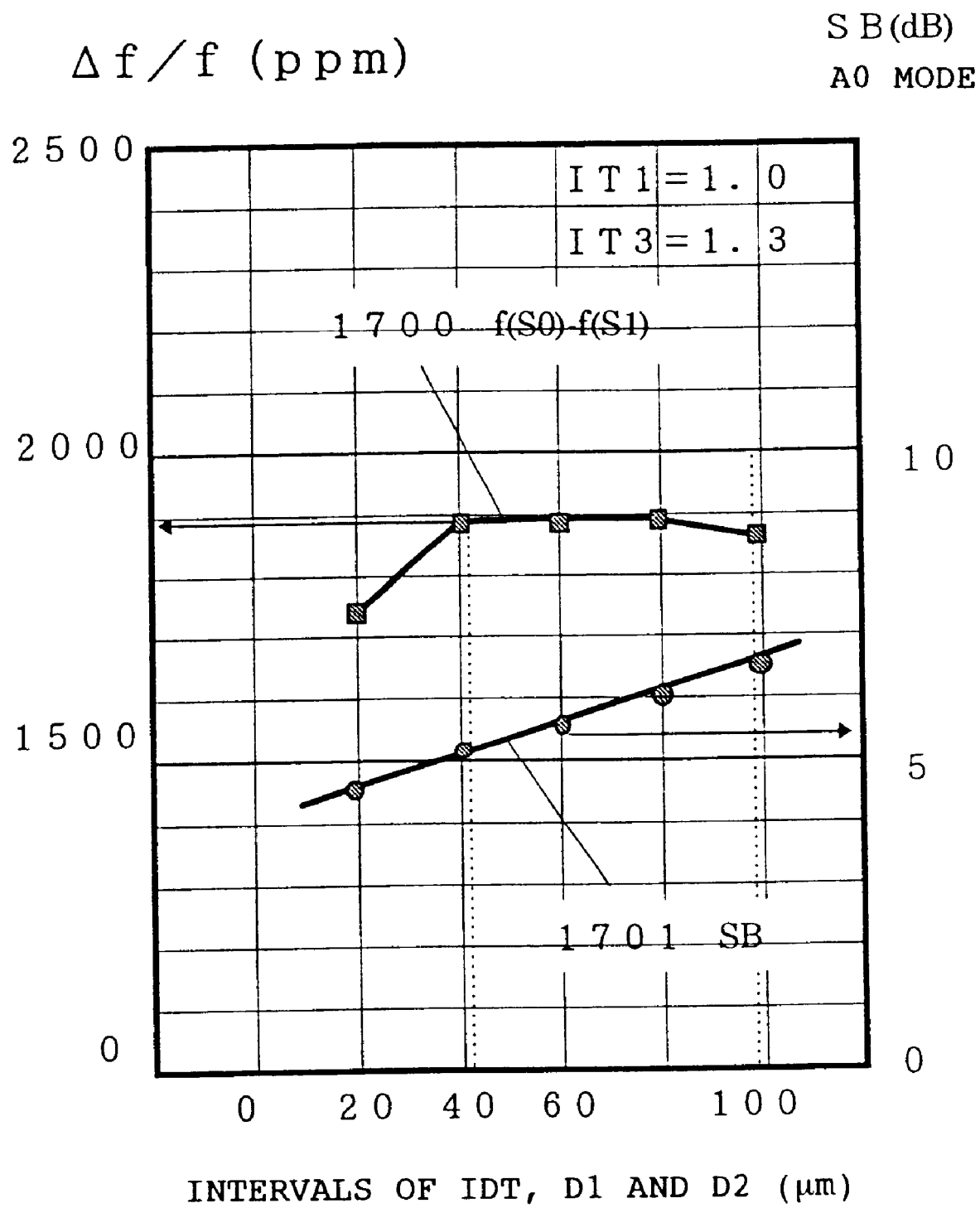

[FIG. 18]
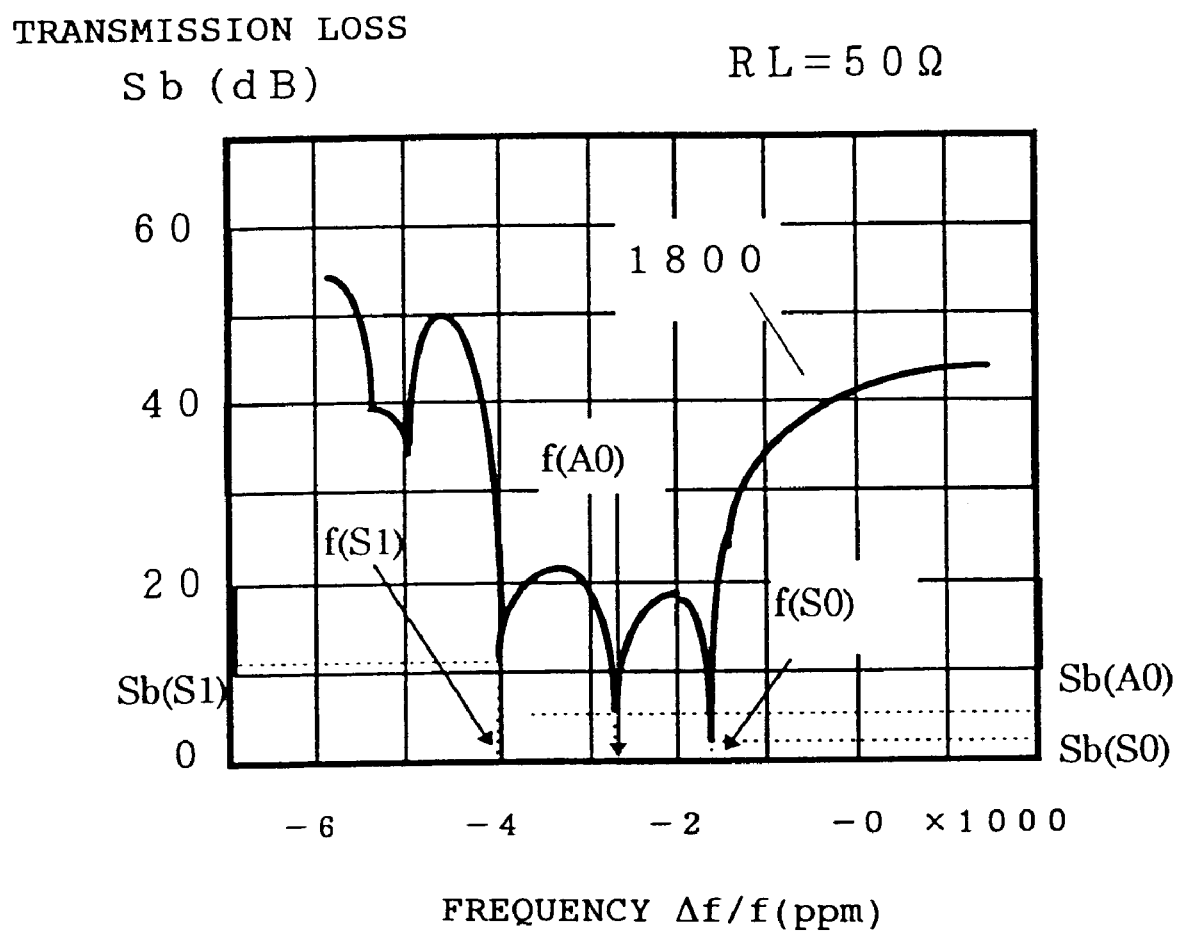

[FIG. 19]
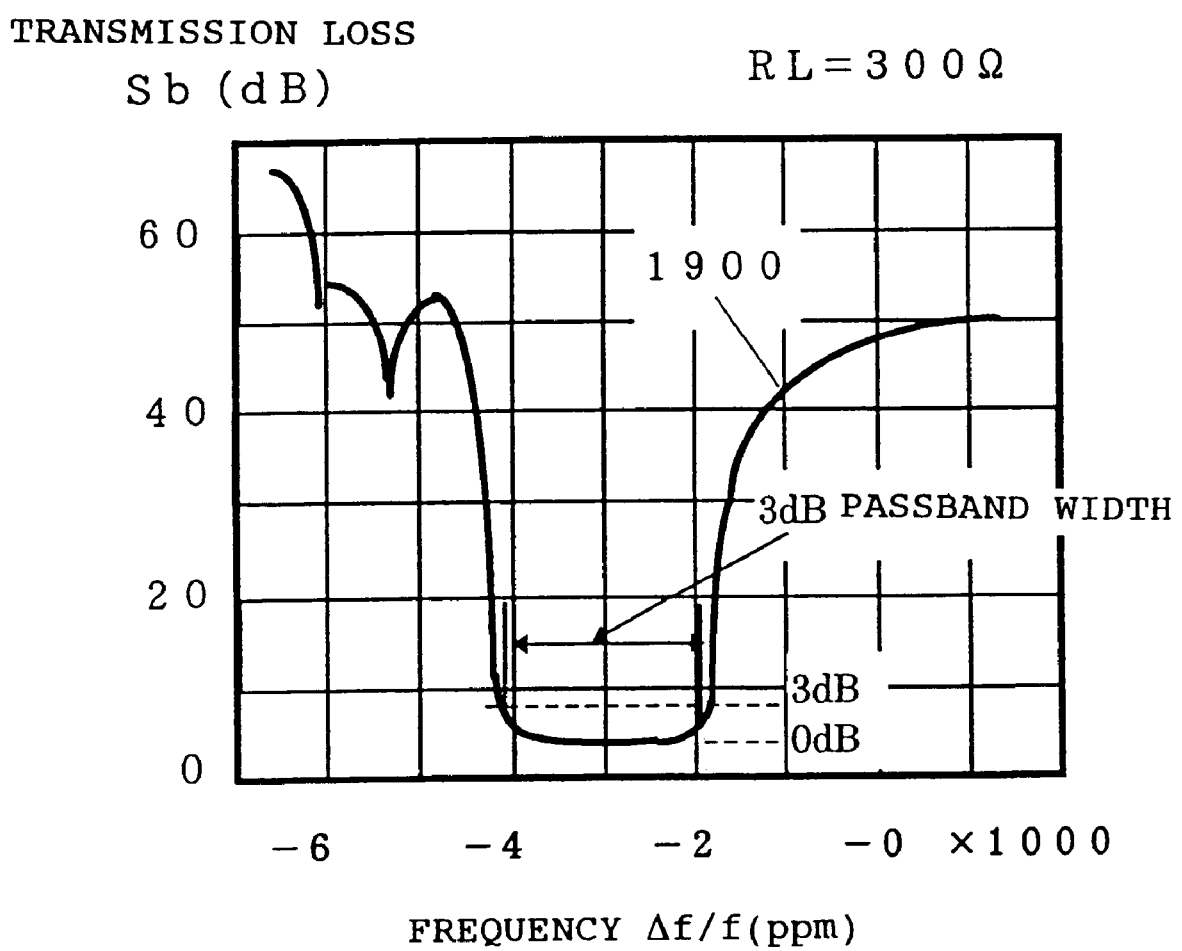

[FIG. 20]
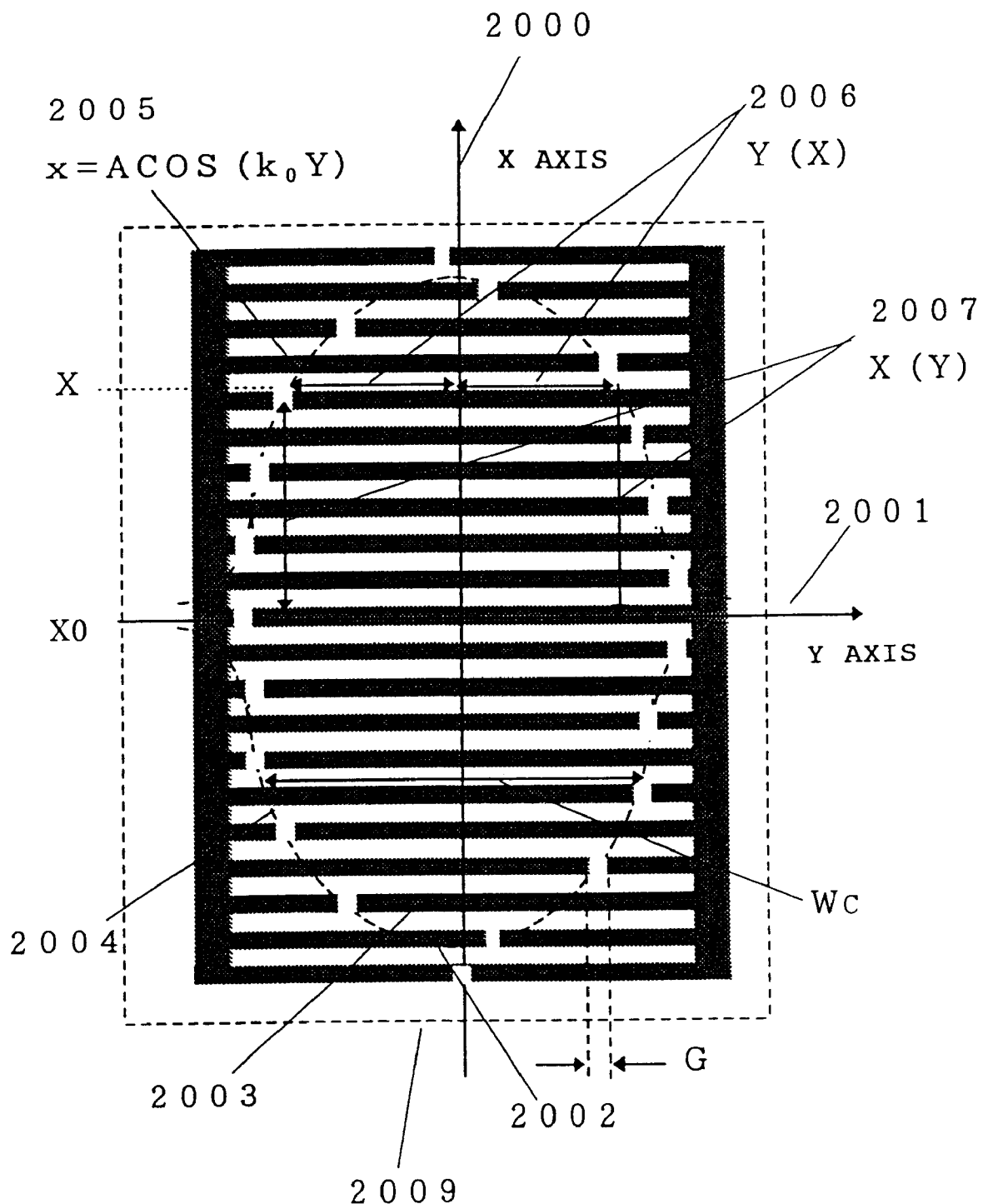

[FIG. 21]
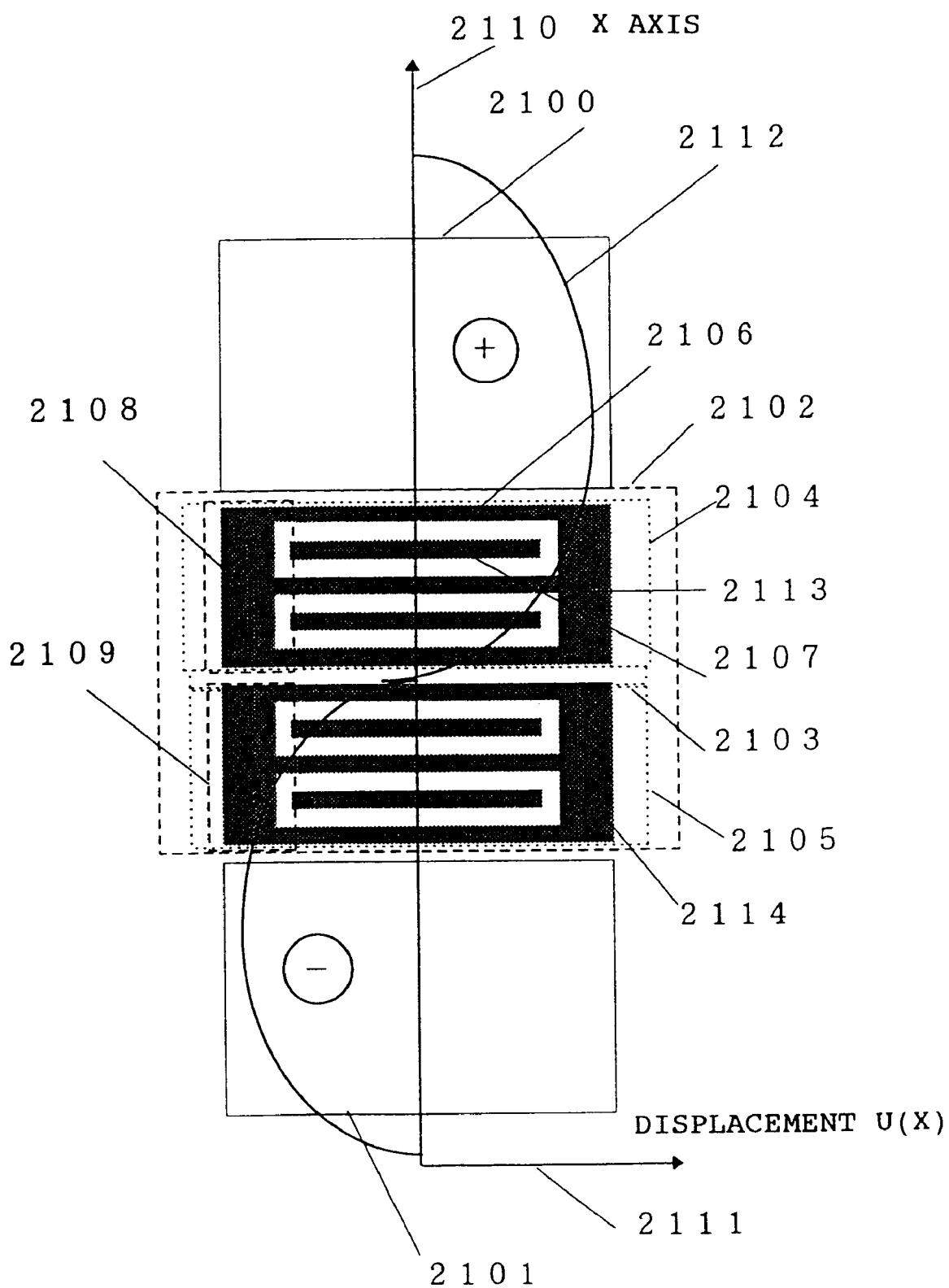

MULTI-LONGITUDINAL MODE COUPLED SAW FILTER

BACKGROUND OF THE INVENTION

1. Field of the Invention

The present invention relates to a surface acoustic wave (hereinafter referred to as SAW) filter which has a third interdigital transducer to control a displacement state of a vibration mode in a multi-longitudinal-mode-coupled resonator type SAW filter that utilizes the surface acoustic wave.

2. Description of Related Art

The construction of a conventional multi-longitudinal-mode-coupled resonator type SAW filter having two interdigital transducers (hereinafter referred to as IDTs) is disclosed in Japanese Unexamined Patent Publication No. 61-285814, and a conventional multi-longitudinal-mode-coupled resonator type SAW filter having three IDTs is disclosed in Japanese Unexamined Patent Publication No. 1-231417.

These conventional arts have the problem that a plurality of longitudinal resonance modes (respectively simply designated S0, A0, and S1) in use are difficult to independently control to equalize resonance amplitudes in two or three resonance modes and to set a passband width to a desired width.

SUMMARY OF THE INVENTION

The present invention is intended to resolve such a problem, and it is an object of the present invention to realize a multi-longitudinal-mode-coupled resonator type SAW filter that permits a passband width to be relatively easily set, and has flat transmission characteristics with equalized insertion losses in the vicinities of upper end frequency and lower end frequency thereof.

A multi-longitudinal-mode-coupled resonator type SAW filter of a first exemplary embodiment includes, on a piezoelectric substrate, a first IDT for exciting a surface acoustic wave, a second IDT for receiving the surface acoustic wave excited by the first IDT, a third IDT, interposed between the first and second IDTs, for controlling the amplitude of the excited surface acoustic wave, and a pair of reflectors which are arranged with the first, second and third IDTs therebetween in the direction of propagation of the surface acoustic wave, wherein the reflectors, the first IDT, the second IDT and the third IDT are formed of parallel metallic conductors that are periodically arranged on the piezoelectric substrate, the distance between the reflector and the closet parallel conductor of the first IDT is set to be equal to the width of a spacing of the first IDT with one period length thereof having alternating spacing and line, the distance between the reflector and the closest parallel conductor of the second IDT is set to be equal to the width of a spacing of the second IDT with one period length thereof having alternating spacing and line, each of the period length PT1 of the parallel conductors of the first IDT and the period length PT2 (=PT1) of the parallel conductors of the second IDT is set to be shorter than the period length PT3 of the parallel conductors of the third IDT (PT3 >PT1, PT2), each of the period lengths PT1 and PT2 is set to be shorter than the period length PR of the parallel conductors of the reflectors, the first, second and third IDTs have a total reflective coefficient $\Gamma$ set to be $10 > \Gamma > 0.8$, and are energy trapped type resonators, and a two-longitudinal-mode-coupled resonator filter is formed of a fundamental wave symmetrically longitudinal mode S0 which has a displacement amplitude function generally symmetrical with respect to a central position in the direction of propagation X in which the surface acoustic wave is standing, and a fundamental wave anti-symmetric mode A0 which has a displacement amplitude function generally anti-symmetrical with respect to the central position.

In accordance with the first exemplary embodiment, the third IDT is arranged between the first and second IDTs, which are input and output electrodes of the filter, and the IDTs have their own frequencies independently set therein. In this arrangement, an insertion loss and frequency locations of two independent natural vibration modes S0 and A0 which vibrate in the longitudinal direction in a standing wave fashion are controllable.

With the relationship of PT1, PT2, and PT3 set in accordance with the first exemplary embodiment, the insertion loss of the A0 mode is reduced, thereby equalizing the insertion losses of both modes. A two-longitudinal-mode-coupled resonator filter having flat transmission characteristics and a bandwidth of 1000 to 1500 ppm results.

In accordance with the first exemplary embodiment, (PR−PT1)/PR=$1\epsilon$ to $1.7\epsilon$ and (PR−PT3)/PR=0 to $0.8\Gamma$ hold where $\Gamma$ is a deviation $(f_{RO}-f_{TO})/f_{RO}$ between a center frequency $f_{RO}$ and a frequency $f_{TO}$ where in the setting of the period lengths PT1, PT2, and PT3, $f_{RO}$ is the reflective wave center frequency of the reflector, and $f_{TO}$ is the frequency at which the first IDT, the second IDT, and the third IDT, when considered as a unit, exhibit a maximum reflective conductance G.

With these ranges set, the filter increases energy trapped in the longitudinal direction in the A0 mode having a peak displacement amplitude in the vicinity of the center of each of IDT 1 and IDT 2, and reduces the insertion loss, thereby equalizing the insertion loss to the insertion loss of the S0 mode. A two-longitudinal-mode-coupled resonator filter having flat transmission characteristics and a bandwidth of 1000 to 1500 ppm results.

In accordance with the first exemplary embodiment, the sum of pairs of electrode fingers M=M1+M2+M3 falls within a range from 140 to 180 where M1 is the number of pairs of electrode fingers of the first IDT, M2 is the number of pairs of electrode fingers of the second IDT, and M3 is the number of pairs of electrode fingers of the third IDT, M1 is set to be equal to M2, and DIV falls within a range from 2.1 to 2.4 where DIV is defined as M1=M/DIV.

The number of pairs of the electrode fingers of each IDT is set in this way, and a frequency difference between the S0 mode and the A0 mode is set to within a range from 1000 to 1500 ppm. A two-longitudinal-mode-coupled resonator filter having this bandwidth results.

In accordance with the first exemplary embodiment, a cross bus bar conductor 1 and a cross bus bar conductor 2, each connected to ground potential, are respectively arranged between the first IDT and the third IDT, and between the second IDT and the third IDT, the total width D1 of the width of the cross bus bar conductor 1 and the widths of the spacings on both sides of the cross bus bar conductor 1 is $n\lambda+(\frac{1}{4})\lambda$ or $n\lambda+(\frac{3}{4})\lambda$ (n=0, 1, 2, ...) where $\lambda$ represents the wavelength of the surface acoustic wave, the total width D2 of the width of the cross bus bar conductor 2 and the widths of the spacings on both sides of the cross bus bar conductor 2 is $n\lambda+(\frac{1}{4})\lambda$ or $n\lambda+(\frac{3}{4})\lambda$ (n=0, 1, 2, ...) where $\lambda$ represents the wavelength of the surface acoustic wave, and each of D1 and D2 is within a range of 20 to 100 $\mu$m or within a range of $2\lambda$ to $3\lambda$.

There are times when an unknown vibration mode in a frequency region higher than that of the S0 mode is generated with resonance modes not limited to the S0 and A0 modes, depending on the values of D1 and D2.

Such an unknown vibration mode is not generated if D1 and D2 are set up as described above, and a regular two-longitudinal-mode-coupled resonator filter constructed of S0 and A0 results. If each of D1 and D2 falls within a range from 20 to 100 $\mu$m or within a range from 2$\lambda$ to 3$\lambda$, the realization of a passband of 1000 to 1500 ppm is not affected.

A multi-longitudinal-mode-coupled resonator type SAW filter of a second exemplary embodiment in this application includes, on a piezoelectric substrate, a first IDT for exciting a surface acoustic wave, a second IDT for receiving the surface acoustic wave excited by the first IDT, a third IDT, interposed between the first and second IDTs, for controlling the amplitude of the excited surface acoustic wave, and a pair of reflectors which are arranged with the first, second and third IDTs interposed therebetween in the direction of the propagation of the surface acoustic wave (in the longitudinal direction X), wherein the reflectors, the first IDT, the second IDT and the third IDT are formed of parallel metallic conductors that are periodically arranged on the piezoelectric substrate, the distance between the reflector and the closet parallel conductor of the first IDT is set to be equal to the width of a spacing of the first IDT with one period length thereof having alternating spacing and line, the distance between the reflector and the closest parallel conductor of the second IDT is set to be equal to the width of a spacing of the second IDT with one period length thereof having alternating spacing and line, each of the period length PT1 of the parallel conductors of the first IDT and the period length PT2(=PT1) of the parallel conductors of the second IDT is set to be longer than the period length PT3 of the parallel conductors of the third IDT (PT3<PT1, PT2), each of the period lengths PT1 and PT2 is set to be shorter than the period length PR of the parallel conductors of the reflectors, the first, second and third IDTs have a total reflective coefficient $\Gamma$ set to be 10>$\Gamma$>0.8, and are energy trapped type resonators, and a three-longitudinal-mode-coupled resonator filter is formed of a fundamental wave symmetrically longitudinal mode S0 which has a displacement amplitude function generally symmetrical with respect to a central position in the direction of propagation X in which the surface acoustic wave is standing, a fundamental wave anti-symmetric mode A0 which has a displacement amplitude function generally anti-symmetrical with respect to the central position, and a primary symmetrically longitudinal mode S1 having two nodes in a vibration displacement amplitude and is generally symmetrical with respect to the central position.

The third IDT is arranged between the first and second IDTs, which are input and output electrodes of the filter, and the IDTs have their own frequencies independently set therein. In this arrangement, insertion losses and frequency locations of two independent natural vibration modes S0 and A0 which vibrate in the longitudinal direction in a standing wave fashion, and further the S1 mode are controllable.

With the relationship of PT1, PT2, and PT3 set in accordance with the second embodiment, the insertion losses of the S1 and A0 modes are reduced, the insertion losses are made substantially equal to that of S0 mode. Flat transmission characteristics are thus achieved. Since a frequency difference between S0 and A0 and a frequency difference between A0 and S1 are equalized, filter impedances are also equalized. A three-longitudinal-mode-coupled resonator filter having small ripples thus results.

In accordance with the second exemplary embodiment, (PR−PT1)/PR=0.7$\epsilon$ to 1.2$\epsilon$ and (PR−PT3)/PR=0.9$\epsilon$ to 1.5$\epsilon$ hold where $\epsilon$ is a deviation $(f_{RO}-f_{TO})/f_{RO}$ between a center frequency $f_{RO}$ and a frequency $f_{TO}$ where in the setting of the period lengths PT1, PT2, and PT3, $f_{RO}$ is the reflective wave center frequency of the reflector, and $f_{TO}$ is the frequency at which the first IDT, the second IDT, and the third IDT, when considered as a unit, exhibit a maximum reflective conductance G.

With the relationship of PT1, PT2, and PT3 set as described above, the insertion losses of the S1 and A0 modes are reduced, and the insertion losses are set to be substantially equal to that of S0 mode. Flat transmission characteristics are thus achieved. Since a frequency difference between S0 and A0 and a frequency difference between A0 and S1 are equalized, filter impedances are also equalized. A three-longitudinal-mode-coupled resonator filter having small ripples thus results.

In accordance with the second exemplary embodiment, the sum of pairs of electrode fingers M=M1+M2+M3 falls within a range from 200 to 300 where M1 is the number of pairs of electrode fingers of the first IDT, M2 is the number of pairs of electrode fingers of the second IDT M2, and M3 is the number of pairs of electrode fingers of the third IDT, M1 is set to be equal to M2, and DIV falls within a range from 2.1 to 2.4 where DIV is defined as M1=M/DIV.

The number of pairs of the electrode fingers of each IDT is set in this way, and a frequency difference between the S0 mode and the S1 mode is set to within a range from 1800 to 2000 ppm. A three-longitudinal-mode-coupled resonator filter having this bandwidth results.

In accordance with the second exemplary embodiment, a cross bus bar conductor 1 and a cross bus bar conductor 2, each connected to ground potential, are respectively arranged between the first IDT and the third IDT, and between the second IDT and the third IDT, the total width D1 of the width of the cross bus bar conductor 1 and the widths of the spacings on both sides of the cross bus bar conductor 1 is n$\lambda$+($\frac{1}{4}$)$\lambda$ or n$\lambda$+($\frac{3}{4}$)$\lambda$ (n=0, 1, 2, ...) where $\lambda$ represents the wavelength of the surface acoustic wave, the total width D2 of the width of the cross bus bar conductor 2 and the widths of the spacings on both sides of the cross bus bar conductor 2 is n$\lambda$+($\frac{1}{4}$)$\lambda$ or n$\lambda$+($\frac{3}{4}$)$\lambda$ (n=0, 1, 2, ...) where $\lambda$ represents the wavelength of the surface acoustic wave, and each of D1 and D2 is within a range of 20 to 100 $\mu$m or within a range of 2$\lambda$ to 3$\lambda$.

There are times when an unknown vibration mode in a frequency region higher than that of the S0 mode is generated with resonance modes not limited to the three modes S0, A0 and S1, depending on the values of D1 and D2.

Such an unknown vibration mode is not generated if D1 and D2 are set up as described above, and a regular three-longitudinal-mode-coupled resonator filter constructed of S0, A0, and S1 results. If each of D1 and D2 falls within a range from 20 to 100 $\mu$m or within a range from 2$\lambda$ to 3$\lambda$, the realization of a passband of 1500 to 2500 ppm is not affected.

In accordance with the first and second exemplary embodiments, the function Wc(X), setting a finger cross width of the first IDT and the second IDT, is determined by equation Wc(X)=A cos ($k_0$Y) where X and Y are related by the following equation A cos ($k_0$Y)=absolute value of (X−$X_0$) and where A is an arbitrary constant, $k_0$ is a wave number of a fundamental wave mode, a displacement function $\psi_0$(Y) of the fundamental wave mode in a transversely inharmonic mode is $\psi_0$(Y)=A cos ($k_0$Y), and $X_0$ represents the central position of the first IDT or the second IDT in the X axis direction.

If the displacement distribution of the fundamental S0 mode in the transverse direction is cos (kY), the excitation efficiency for the group of harmonic modes, each having at least one node in the transverse direction, is set to be zero, and the harmonic waves other than the fundamental wave S0 are suppressed. Since no spurious emissions take place from the transverse harmonic mode in this arrangement, a SAW filter free from amplitude ripples in the passband results.

Furthermore, the finger cross width Wc(X) of the first IDT and the second IDT is formed by separating a group of electrode fingers connected between positive and negative feeder conductors of the first IDT and the second IDT, by a spacing equal to or narrower than the ¼ wavelength of the surface acoustic wave.

As the width of the separation between electrode fingers is decreased, the distortion of the displacement distribution in the transverse direction is reduced, and the displacement relationship between the ideal fundamental wave and the harmonic mode is maintained. The excitation efficiency of the transverse harmonic mode group can be set to be zero. By separating the group of the electrode fingers by the spacing equal to or narrower than the ¼ wavelength, the spurious emission of the transverse harmonic mode group is suppressed, and a SAW filter free from amplitude ripples in the passband results.

In accordance with the first and second exemplary embodiments, the third IDT has a pattern that is divided and separated at the central position in the direction of propagation of X.

The A0 mode has, at the central position in the X axis, a vibration displacement serving as a node. For this reason, if the third IDT is not patterned to be divided and separated at the central position in the direction of propagation of X, positive and negative charges neutralize each other, liberating Joule heat in energy loss, reducing the Q factor, and thereby increasing the insertion loss in the A0 mode. By patterning the third IDT to be divided and separated at the central position in the direction of propagation of X, the increase in the insertion loss in the A0 mode is prevented, and the ripples in the filter passband are eliminated.

In accordance with the first and second exemplary embodiments, the third IDT has the positive and negative electrode fingers, one of which is connected to neither of the feeder conductors on both sides thereof In each mode, a vibration state alternates at each electrode finger. When both positive and negative electrode fingers are connected to the feeder conductors, the positive and negative charges neutralize each other in the third IDT, liberating Joule heat in energy loss, reducing the Q factor, and thereby increasing the insertion loss. By leaving one of the positive and negative electrode fingers unconnected to the feeder conductor, the increase in the insertion loss is prevented, and the ripples in the filter passband are eliminated.

In accordance with the first and second exemplary embodiments, the piezoelectric substrate is an ST cut crystal.

The ST cut crystal is excellent in frequency-temperature characteristics and provides a high Q factor in the material of the substrate, thereby making a SAW filter having a high S/N ratio.

BRIEF DESCRIPTION OF THE DRAWINGS

FIG. 1 is a plan view showing a multi-longitudinal-mode-coupled resonator type SAW filter of one embodiment of the present exemplary embodiment.

FIG. 2 is a conceptual view showing the state of the vibration displacement of the multi-longitudinal-mode-coupled resonator type SAW filter of one embodiment of the present exemplary embodiment.

FIG. 3 is a conceptual view showing an energy trap phenomenon by an SAW resonator.

FIG. 4 is a characteristic diagram showing the basic property of a piezoelectric substrate having a grating thereon.

FIG. 5 is a characteristic diagram showing the relationship between a frequency potential and an insertion loss in the multi-longitudinal-mode-coupled resonator type SAW filter of the present exemplary embodiment.

FIG. 6 is a characteristic diagram showing a total number of pairs M versus a frequency difference between vibration modes in the multi-longitudinal-mode-coupled resonator type SAW filter shown in FIG. 1.

FIG. 7 is a characteristic diagram showing the number of IDT divisions DIV versus the frequency difference between vibration modes in the multi-longitudinal-mode-coupled resonator type SAW filter shown in FIG. 1.

FIG. 8 is a characteristic diagram showing the total widths D1 and D2 of IDTs versus the frequency difference between vibration modes in the multi-longitudinal-mode-coupled resonator type SAW filter shown in FIG. 1.

FIG. 9 is a characteristic diagram showing the transmission characteristics of a conventional 50Ω terminated multi-longitudinal-mode-coupled resonator type SAW filter.

FIG. 10 is a characteristic diagram showing the transmission characteristics of the 50Ω terminated multi-longitudinal-mode-coupled resonator type SAW filter of the present exemplary embodiment.

FIG. 11 is a characteristic diagram showing the transmission characteristics of the multi-longitudinal-mode-coupled resonator type SAW filter of the present exemplary embodiment in the impedance matched state thereof FIG. 12 is a plan view showing the multi-longitudinal-mode-coupled resonator type SAW filter of another embodiment of the present exemplary embodiment.

FIG. 13 is a conceptual view showing the state of the vibration displacement of the multi-longitudinal-mode-coupled resonator type SAW filter of the embodiment of the present exemplary embodiment.

FIG. 14 is a characteristic diagram showing the relationship of a frequency potential, bandwidth, and insertion loss in the multi-longitudinal-mode-coupled resonator type SAW filter of the embodiment of the present exemplary embodiment.

FIG. 15 is a characteristic diagram showing the total number of pairs M versus the frequency difference between vibration modes in the multi-longitudinal-mode-coupled resonator type SAW filter of the one embodiment of shown in FIG. 12.

FIG. 16 is a characteristic diagram showing the total number of IDT divisions DIV versus the frequency difference between the vibration modes in the multi-longitudinal-mode-coupled resonator type SAW filter shown in FIG. 12.

FIG. 17 is a characteristic diagram showing the total widths D1 and D2 of IDTs versus the frequency difference between the vibration modes, and insertion loss in the multi-longitudinal-mode-coupled resonator type SAW filter shown in FIG. 12.

FIG. 18 is a characteristic diagram showing the transmission characteristics of the 50Ω terminated multi-longitudinal-mode-coupled resonator type SAW filter shown in FIG. 12.

FIG. 19 is a characteristic diagram showing the transmission characteristics of the multi-longitudinal-mode-coupled resonator type SAW filter in the impedance matched state thereof.

FIG. 20 is a plan view showing one embodiment of first and second IDTs in the multi-longitudinal-mode-coupled resonator type SAW filter of the present invention.

FIG. 21 is a plan view showing another embodiment in the multi-longitudinal-mode-coupled resonator type SAW filter of the present invention.

DETAILED DESCRIPTION OF PREFERRED EMBODIMENTS

The principle of the present exemplary embodiment is discussed before discussing specific embodiments of the present invention. The basics relating to the present invention are first discussed.

A piezoelectric material, such as quartz crystal, lithium tantalate, PZT, lithium tetraborate, is sliced into a flat substrate, the substrate is mirror-polished, a number of parallel electrode fingers, made of a metal, such as aluminum or copper, are arranged in a periodic pattern perpendicular to the direction of phase propagation of a surface acoustic wave, such as Rayleigh type surface wave, lamb wave, or leaky surface wave to produce an IDT, and a pair of reflectors is arranged on both sides of the IDT, each reflector being composed of a number of parallel strip conductors arranged in a periodic fashion. A one-port type SAW resonator thus results.

A so-called energy trapped type resonator is known to be realized which has vibration energy concentrated in the center thereof if a total reflective coefficient Γ, defined as expressed by the following equation (1), is set to be 10>Γ>0.8 when the IDT is constructed of M pairs, each pair composed of positive and negative electrodes, in the one-port type SAW resonator (Reference: Energy Trapped Surface Acoustic Wave Resonator, Shingaku-Giho US87-36, pp 9–16(September 1987)).

$$\Gamma = 4 \text{ MbH}/\lambda \tag{1}$$

where M represents the number of pairs of the IDT, b represents a reflective coefficient per electrode of the surface acoustic wave, H represents the thickness of the conductor, and λ represents the wavelength of the surface acoustic wave.

For instance, if the IDT is fabricated of an ST cut quartz crystal substrate and an Al conductor with b=0.255, H/λ= 0.03, and M=80 pairs, a one-port energy trapped type SAW resonator shown in FIG. 1 results. In this case, Γ=approximately 2.448.

In the energy trapped type SAW resonator thus constructed, standing waves, called the transversely inharmonic modes, are known to occur perpendicular to the direction of the propagation of the surface acoustic wave, namely, in the transverse direction of the SAW resonator.

Equation (the following equation (2)) governing the transversely inharmonic modes and the analysis of the displacement associated with the natural mode thereof are discussed in the paper presented by the inventors of this invention: Paragraph 3.3 Resonance Frequency of the Transverse Mode, in "K Cut SAW Resonator Having Dynamic and Static Zero Temperature Coefficient At Room Temperature" (25th EM Symposium P. 79–80).

$$a\omega_0^2 V(Y)_{,YY} + (\omega^2 - \omega_0^2)V(Y) = 0 \tag{2}$$

where $V(Y)_{,YY}$ is a simplified second-order derivative form of a displacement function $V(Y)$, $\omega$ is an angular frequency, $\omega_0$ is the angular frequency of the element in a region of interest, a is an effective transverse shearing stiffness constant (dimensionless), $V(Y)$ is an amplitude of the transverse displacement of the surface wave, and Y is a y coordinate normalized by the wavelength of the surface wave.

The inventors have found that the above equation (2) is applicable to the longitudinally inharmonic modes if the constant a is modified, although the longitudinally inharmonic modes have been conventionally calculated using "the mode coupling theory" or "the analysis of electrically equivalent circuits in an acoustic propagation path".

Specifically, in the ST cut crystal, the transversely inharmonic mode group is of a frequency-dropped-type, energy trapped type (a positive value a=0.033), and this corresponds to the fact that all resonance frequencies in the transversely inharmonic mode group are present in a frequency region above a principal resonance frequency.

On the other hand, in contrast to the transversely inharmonic mode group, the longitudinally inharmonic mode group is of a frequency-upward-type, energy trapped type (a negative value a=−4.4), and this corresponds to the fact that all resonance frequencies in the longitudinally inharmonic mode group are present in a frequency region below the principal resonance frequency.

In other words, those which are realized by lowering the frequency of one IDT where vibration energy is intensively trapped, below the frequency of another IDT adjacent thereto, are the transversely inharmonic mode group (of frequency-dropped type), and those which are realized by raising the frequency of one IDT where vibration energy is intensively trapped, above the frequency of another IDT adjacent thereto, are the longitudinally inharmonic mode group (of frequency-upward type).

The difference between the two groups corresponds to the difference between the position and negative constants a. The values of a are measurement values of one-port type SAW resonator. To apply equation (2) to the longitudinal mode, a=−4.4 and the coordinate Y is replaced with X. The equation with respect to the X axis becomes the following equation (3). In common practice, the X axis direction is referred to as the longitudinal direction.

$$a_X \omega_0^2 U(X)_{,XX} + (\omega^2 - \omega_0^2)U(X) = 0 \tag{3}$$

where $U(X)_{,XX}$ is a simplified second-order derivative form of a displacement function $U(X)$, $\omega$ is an angular frequency, $\omega_0$ is the angular frequency of the element in a region of interest, $a_X$ is an effective transverse shearing stiffness constant (dimensionless), $U(X)$ is an amplitude of the longitudinal displacement of the surface wave, and X is an x coordinate normalized by the wavelength of the surface wave.

The energy trap state in the longitudinal direction X is studied using equation (3).

Now discussed is the example shown in FIG. 3. Referring to FIG. 3, the IDT region in the one-port type SAW resonator has the angular frequency $\omega_0$ of the element, expressed by a spatial angular frequency $\omega_I = 2\pi V_S/(2PT)$, where $V_s$ represents the speed of the surface acoustic wave, and PT represents the period length of the electrode finger in the IDT. The reflector has an element angular frequency $\omega_0=\omega_R=2\pi V_S/(2PR)$, where PR represents the period length of the strip conductor of the reflector. The element angular frequency $\omega_0$ is also expressed by a function $\omega_0(X)$ as a function of the coordinate X, and is thus called a frequency potential (the ordinate in the upper portion of FIG. 3). In this case, $\omega_R<\omega_T$. Vibration displacement solution U(X) is now determined in connection with two setting levels 301 and 303 for $\omega_T$ using equation (3). U(X) 305 is thus obtained for $\omega_T$ 301, and U(X) 304 is obtained for $\omega_T$ 303.

Referring to FIG. 3, the U(X) curve 305 presents a displacement distribution more concentrated in the center than the U(X) curve 304. This fact indicates that the setting of $\omega_R<\omega_T$ causes the energy trap phenomenon to take place in the longitudinal direction X. The present exemplary embodiment takes advantage of this phenomenon. This fact is also confirmed by a simulation using the conventional transmission line equivalent circuit or a calculation using the mode coupling theory.

In the following discussion, $\omega_R$ and $\omega_T$ are normalized to describe the design parameters of elements in an easy-to-understand fashion. The angular frequencies are thus generally applicable even if the frequency of each element changes. The method for this is shown in FIG. 4. As shown, the abscissa represents the frequency, while the ordinate represents the reflective coefficient $\Gamma(f)$ of the reflector and the reflective conductance G(f) of the IDT shown in relative scales. This G(f) is a real part of the admittance Y(f) of the IDT, and indicates the quantity of the emitted surface acoustic wave. The reflective coefficient $\Gamma(f)$ is a ratio, B/A, of the amplitude A of the surface acoustic wave incident on the reflector to the amplitude B of the surface acoustic wave reflected from the reflector. The G(f) curve 401 reaches a maximum value Gmax thereof at a frequency $f_{TO}$, and the $\Gamma(f)$ curve 402 reaches a maximum value $\Gamma$ Gmax thereof at a frequency $f_{RO}$. The characteristics shown in FIG. 4 are experienced when the substrate has an energy-upward type, energy trapped substrate, such as an ST cut, X-propagating quartz crystal having aluminum electrodes thereon. A physical value $\epsilon$ is defined as $\epsilon=(f_{RO}-f_{TO})/f_{RO}$ from the above-referenced frequencies $f_{RO}$ and $f_{TO}$, and is then used as a criterion for design parameters of the present invention. The basics of the present invention have been discussed, and the embodiments of the present invention are now specifically discussed.

Embodiment 1

Discussed next is one embodiment of a two-longitudinal-mode-coupled resonator type SAW filter, among multi-longitudinal-mode-coupled resonator type SAW filters, constructed of the vibration modes of a fundamental-wave symmetrically longitudinal mode S0 and a fundamental-wave anti-symmetric mode A0, referring to FIG. 1 and FIG. 2. Also, the characteristics thereof are discussed referring to FIG. 5 through FIG. 11.

FIG. 1 is one embodiment of the multi-longitudinal-mode-coupled resonator type SAW filter of the present invention. Shown in FIG. 1 are a piezoelectric substrate 100, a reflector 1 designated 101 and enclosed in a broken line box, a reflector 2 designated 107 and enclosed in a broken line box, interdigital transducers 102, 104, and 106 (IDT 1, IDT 3, and IDT 2), each enclosed in a broken line box, strip conductors 112 of the reflector 1, strip conductors 113 of the reflector 2, a negative electrode finger (ground electrode finger) 114 of the IDT 1 (102), a positive electrode finger 115 of the IDT 1 (102), an X axis 116 which is aligned with the direction of propagation of the surface acoustic wave perpendicular to the strip conductors and the electrode fingers, and an $\omega(X)$ axis indicating the above-discussed frequency potential. A step line 117 represents a frequency potential function, plotted in the X direction, of the multi-longitudinal-mode-coupled resonator type SAW filter of the present invention. Designated 103 and 105 are respectively a cross bus bar conductor 1 and a cross bus bar conductor 2, which cross the propagation path of the surface acoustic wave to couple the electrode fingers of adjacent IDTs. The cross bus bar conductor 2 (105) has a half portion only. Also shown are a signal source 108 connected to the positive electrode finger group of the transmitter IDT 1, 102, and a load resistor 110 connected to the positive electrode finger group of the receiver IDT 2, and symbols 109 and 111 indicate that the multi-longitudinal-mode-coupled resonator type SAW filter of the present invention is connected to external ground terminals (ground such as an external casing). Designated PR is the period length of the strip conductors of the reflector 1 (101) and the reflector 2 (107) in which the strip conductors are arranged in a periodic pattern. PT1, PT2, and PT3 respectively represent the period lengths of the electrode fingers of the IDT 1 (102), the IDT 2 (106), and the IDT 3 (104).

The piezoelectric substrate 100 is fabricated of a quartz crystal substrate (ST cut or K cut) sliced from a quartz single crystal, or of a piezoelectric substrate that is constructed by mirror-polishing a lithium tantalate. Conductor patterns, forming the IDT 102, the IDT 104, and the IDT 106, and the reflectors 101 and 107, are produced by forming conductor metallic films of Al or the like, on the piezoelectric substrate, using film forming methods such as deposition or sputtering, and then by patterning the conductor metallic films through a lithographic technique. The three IDTs and the pair of reflectors form the multi-longitudinal-mode-coupled resonator type SAW filter having two pairs of terminals.

The important point in the design of the energy trapped type resonator of the present invention is that a so-called energy trapped type SAW resonator having a total reflective coefficient $\Gamma$, as defined by the above-referenced equation (1), and set to be 10 >$\Gamma$>0.8 is constructed when all electrodes of the three interdigital transducers of IDT 1, IDT 2, and IDT 3 have a total of M pairs with the electrode finger 114 (the negative electrode) and the electrode finger 115 (the positive electrode) counted as one pair.

With b=0.255, H/$\lambda$=0.03, and M=80 pairs in the IDT, made of aluminum, and formed on an ST cut quartz crystal, the one-port SAW resonator shown in FIG. 1 is easily produced. As already discussed, the reflective coefficient $\Gamma$ becomes approximately 2.448. In accordance with the present invention, the M pairs are distributed among the three interdigital transducers IDT 1, IDT 2, and IDT 3, and the first IDT 1 is set to be to the transmitter side of the filter, and the second IDT 2 is set to be the receiver side of the filter. The distance between the closest parallel conductors of the reflector 1 and the IDT 1 is set to be equal to the width of the spacing of one period length of the IDT 1, in which the one period length is composed of a line (a portion covered with the metal conductor) and the spacing (a portion not covered with the metal conductor). The same is true of the distance between the closest parallel conductors of the reflector 2 and the IDT 2.

The second important point in the construction of the multi-longitudinal-mode-coupled resonator type SAW filter is that the IDT 1, the IDT 2, and the IDT 3 have the frequency potential values represented by the step line 117 shown in FIG. 1. The IDT 1 has a frequency potential value of $\omega_1$, the IDT 2 has a frequency potential value of $\omega_2$ (=$\omega_1$) and the IDT 3 has a frequency potential of value of $\omega_3$.

The equations relating the frequency potentials to the period length are already discussed. Specifically, $\omega_1=2\pi V_S/(2\times PT1)$, $\omega_2=2\pi V_S/(2\times PT2)$, $\omega_3=2\pi V_S/(2\times PT3)$, $\omega_R=2\pi V_S/(2\times PR)$. In the present invention, $\omega_1$, $\omega_2>\omega_3$ and $\omega_1$, $\omega_2>\omega_R$ hold. If the equations of the period lengths are substituted into these relationships, the relationships PT3>PT1, PT2 and PT1, PT2<PR result. These values may be advantageously normalized by PR. Specifically, ITi is defined as ITi=(PR−PTi)/PR/$\epsilon$(i=1−3). ITi is now referred to as a frequency rise rate of each IDT. These values will discussed later in detail.

FIG. 2 shows the operation of the multi-longitudinal-mode-coupled resonator type SAW filter 209 thus constructed of the present invention. Designated 200 and 201 in FIG. 2 are states of the displacement amplitudes in two natural vibration modes (envelopes U(X) of the vibration state v(X)=U(X) sin (kX+$\phi$)) used in the present invention. The S0 designated by 200 mode is called the fundamental-wave symmetrically longitudinal mode, and the A0 designated by 201 mode is called the fundamental-wave anti-symmetric mode. As shown, the reflector 1 and the reflector 2 are respectively designated 202 and 206, and the IDT 1, the IDT 2, and the IDT 3 are respectively designated 203, 205, and 204. Designated 207 is an X axis that is aligned with the direction of the propagation of the surface acoustic wave, and designated 208 is an axis representing the magnitude of the displacement U(X).

The operational characteristics of the multi-longitudinal-mode-coupled resonator type SAW filter of the present invention shown in FIG. 1 are discussed referring to FIG. 5 through FIG. 11.

FIG. 9 shows the operational transmission characteristics 900, in a 50 Ω system, of the multi-longitudinal-mode-coupled resonator type SAW filter which has been measured with a load resistance of 50 Ω (110 in FIG. 1). As shown in FIG. 9, the S0 mode results in an insertion loss of Sb(S0) (dB) at a frequency f(S0), and the A0 mode results in an insertion loss of Sb(A0) (dB) at a frequency f(A0). These respectively represent the magnitudes of the resonance amplitudes of the fundamental-wave symmetrically longitudinal mode S0 and the fundamental-wave anti-symmetric mode A0. The larger the resonance amplitude, the smaller the values of Sb(S0) and Sb(A0). In the conventional art, the insertion loss Sb(A0) is larger than the insertion loss Sb(S0) as shown in FIG. 9, and the flatness of the passband of the filter is thus degraded.

The present invention has improved the flatness of the passband of the filter, by arranging the IDT 3, 104, shown in FIG. 1, to control the vibration mode amplitudes of the S0 and A0 modes.

FIG. 5 shows the variations in the insertion losses Sb(S0) and Sb(A0) when the frequency rise rate IT1 of the IDT 1 (102 in FIG. 1) is changed. The frequency rise rate IT3 of the IDT 3 falls within a range from 0 to 0.7. As shown in FIG. 5, 500 designates the insertion loss Sb(A0) in the A0 mode, and 501 designates the insertion loss Sb(S0) in the S0 mode. By setting the frequency rise rate of the IDT 1 to be one or larger, the insertion loss Sb(A0) becomes close to the insertion loss Sb(S0), and the flatness of the filter is thus improved. The reason for this is thought to be the frequency rise rates of the IDT 1 and IDT 2 in the A0 (201) mode shown in FIG. 2 being set higher than one. Such frequency rise rates enhance the energy trapping phenomenon, increasing the Q factor (the sharpness of the resonance) of the resonator, and thereby reducing the insertion loss (see FIG. 3). The 50 Ω transmission characteristics thus obtained are represented by a curve 1000 as shown in FIG. 10. In this case, Sb(A0) becomes nearly equal to Sb(S0). When impedance matching is accomplished with the load resistance RL (110 shown in FIG. 1) set to 300 Ω, operational transmission characteristics 1100 are obtained as shown in FIG. 11. As seen from FIG. 11, a 3 dB passband becomes flat.

Other setup conditions of the present invention are now discussed. In common setup conditions, the piezoelectric substrate (100 in FIG. 1) is an ST cut, X propagating quartz crystal (the surface acoustic wave propagating in the X axis direction on a 30 to 40 degree rotary Y substrate is used), the finger cross width of the IDT is 30 to 40 wavelengths ($\lambda$), and the ratio H/$\lambda$ of the thickness H of an electrode of aluminum to the wavelength $\lambda$ (=2×PT1) of the surface acoustic wave falls within a range from 2% to 4%. Discussed referring to FIG. 6 through FIG. 8 are other setup conditions in FIG. 1, namely the setting of the number of electrode finger pairs M1, M2, and M3 of the IDT 1, IDT 2, and IDT 3, and the width dimensions D1 and D2 of the cross bus bar conductor 1 and the cross bus bar conductor 2, respectively designated 103 and 105 in FIG. 1.

FIG. 6 shows characteristics 600 indicating frequency difference $\Delta f=(f(S0)-f(A0))/f(S0)$ (unit ppm), giving the filter passband width from f(S0) and f(A0), for the total number of pairs M(=M1+M2+M3). To obtain $\Delta f$ to within a range of 1000 to 1500 ppm, typically required of a quartz crystal having good frequency-temperature characteristics, M within a range from 140 to 180 proves good.

FIG. 7 shows the setup for determining the number of pairs in each IDT (line 700). The number of pairs is determined by M1=M2=M/DIV and M3=M−2×M1 where DIV is the number of divisions of the IDT. If the number of divisions DIV is within a range from 2.1 to 2.4, a passband width of 1000 to 1500 ppm results.

FIG. 8 shows the setup for determining the finger cross widths D1 and D2. As the basic setup, cross bus bar conductors connected to ground are respectively arranged between the IDT 1 and the IDT 3, and between the IDT 2 and the IDT 3 to generate single resonance modes (S0 and A0 only), and the total length D1 or D2 of the width of the cross bus bar conductor and spacings on both sides thereof is set to be n$\lambda$+(¼)$\lambda$ or n$\lambda$+(¾)$\lambda$.0 (n=0, 1, 2, . . . ) where the wavelength $\lambda$ of the surface acoustic wave =2(PT1) or 2(PT2). If this setting is not followed, an unknown mode, assumed to be non-energy-trapped-type fundamental mode, takes place in the vicinity of 10000 ppm in a frequency region above the S0 mode. This is thought to be caused by the radiation wave in the upper transmission band that is one of the attributes of the substrate. Referring to FIG. 8, a passband width $\Delta f$ having 1000 to 1500 ppm is assured if each of D1 and D2 falls within a range of 20 to 100 $\mu$m (corresponding to 2 to 3$\lambda$). In this case, the frequency rise rates are IT1=IT2=1.6, and IT3=0.7.

Embodiment 2

Discussed next is a second embodiment of the present invention in which a three-longitudinal-mode-coupled resonator filter of multi-longitudinal-mode-coupled resonator filters is constructed of three vibration modes of a fundamental-wave symmetrically longitudinal mode S0, a fundamental-wave anti-symmetric mode A0, and a primary symmetrically longitudinal mode S1. Referring to FIG. 12 and FIG. 13, the second embodiment is discussed, and the characteristics thereof are discussed referring to FIG. 14 through FIG. 19. Since the fundamental wave is zero-order in the context of this specification, the primary mode is a harmonic mode.

FIG. 12 shows another example of the multi-longitudinal-mode-coupled resonator type SAW filter of the present invention. Shown in FIG. 12 are a piezoelectric substrate 1200, a reflector 1 designated 1201 and enclosed in a broken line box, a reflector 2 designated 1207 and enclosed in a broken line box, interdigital transducers 1202, 1204, and 1206 (IDT 1, IDT 3, and IDT 2), each enclosed in a broken line box, strip conductors 1212 of the reflector 1, strip conductors 1213 of the reflector 2, a negative electrode finger (ground electrode finger) 1214 of the IDT 1, a positive electrode finger 1215 of the IDT 1, an X axis 1216 which is aligned with the direction of propagation of the surface acoustic wave perpendicular to the strip conductors and the electrode fingers, and an ω axis perpendicular to the axis 1216 indicating the above-discussed frequency potential. A step line 1217 is a frequency potential function, showing the state thereof in the X direction, of the multi-longitudinal-mode-coupled resonator type SAW filter of the present invention. Designated 1203 and 1205 are respectively a cross bus bar conductor 1 and a cross bus bar conductor 2, which cross the propagation path of the surface acoustic wave to couple the electrode fingers of adjacent IDTs. The cross bus bar conductor 2 (1205) has a half portion only. Also shown are a signal source 1208 connected to the positive electrode finger group of the transmitter IDT 1, 1202, and a load resistor 1210 connected to the positive electrode finger group of the receiver IDT 2, and symbols 1209 and 1211 indicate that the multi-longitudinal-mode-coupled resonator type SAW filter of the present invention is connected to external ground terminals (ground such as an external casing). Designated PR is the period length of the strip conductors of the reflector 1 (1201) and the reflector 2 (1207) in which the strip conductors are arranged in a periodic pattern. The PT1, the PT2, and the PT3 respectively represent the period lengths of the electrode fingers of the IDT 1 (1202), the IDT 2 (1206), and the IDT 3 (1204).

The piezoelectric substrate 1200 is fabricated of a quartz crystal substrate (ST cut or K cut) sliced from a quartz single crystal, or of a piezoelectric substrate that is constructed by mirror-polishing a lithium tantalate. Conductor patterns, forming the IDT 1202, the IDT 1204, and the IDT 1206, and the reflectors 1201 and 1207, are produced by forming conductor metallic films of Al or the like, on the piezoelectric substrate, using film forming methods such as deposition or sputtering, and then by patterning the conductor metallic films through a lithographic technique. The three IDTs and the pair of reflectors form the multi-longitudinal-mode-coupled resonator type SAW filter (three-longitudinal-mode-coupled resonator type SAW filter) having two pairs of terminals.

The important point in the design of the energy trapped type resonator of the present invention is that a so-called energy trapped type SAW resonator having a total reflective coefficient Γ, as defined by the above-referenced equation (1), and set to be 10>Γ>0.8 is constructed when all electrodes of the three interdigital transducers of IDT 1, IDT 2, and IDT 3 have a total of M pairs with the electrode finger 1214 (the negative electrode) and the electrode finger 1215 (the positive electrode) counted as one pair.

With b=0.255, H/λ=0.03, and M=80 pairs in the IDT, made of aluminum, and formed on an ST cut quartz crystal, the one-port SAW resonator shown in FIG. 12 is easily produced. As already discussed, the reflective coefficient Γ becomes approximately 2.448. In accordance with the present invention, the M pairs are distributed among the three interdigital transducers IDT 1, IDT 2, and IDT 3, and the first IDT 1 is set to be to the transmitter side of the filter, and the second IDT 2 is set to be the receiver side of the filter. The distance between the closest parallel conductors of the reflector 1 and the IDT 1 is set to be equal to the width of the spacing of one period length of the IDT 1, in which the one period length is composed of a line (a portion covered with the metal conductor) and the spacing (a portion not covered with the metal conductor). The same is true of the distance between the closest parallel conductors of the reflector 2 and the IDT 2.

The second important point in the construction of the multi-longitudinal-mode-coupled resonator type SAW filter is that the IDT 1, IDT 2, and IDT 3 have the frequency potential values represented by the step line 1217 shown in FIG. 12. The IDT 1 has a frequency potential value of $\omega_1$, the IDT 2 has a frequency potential value of $\omega_2(=\omega_1)$, and the IDT 3 has a frequency potential of value of $\omega_3$.

The equations relating the frequency potentials to the period length are already discussed. Specifically, $\omega_1=2\pi V_S/(2\times PT1)$, $\omega_2=2\pi V_S/(2\times PT2)$, $\omega_3=2\pi V_S/(2\times PT3)$, $\omega_R=2\pi V_S/(2\times PR)$. In the second embodiment of the present invention, $\omega_1$, $\omega_2<\omega_3$ and $\omega_1$, $\omega_3$, $\omega_2>\omega_R$ hold. If the equations of the period lengths are substituted into these relationships, the relationships PT3<PT1, PT2 and PT1, PT2<PR result. These values may be advantageously normalized by PR. Specifically, ITi is defined as ITi=(PR−PTi)/PR/ε(i=1−3). ITi is now referred to as a frequency rise rate of each IDT. These values will discussed later in detail.

FIG. 13 shows the operation of the multi(three)-longitudinal-mode-coupled resonator type SAW filter thus constructed of the present invention. Designated 1300, 1301, and 1310 in FIG. 13 are states of the displacement amplitudes in three natural vibration modes (envelopes U(X) of the vibration state v(X)=U(X) sin (kX+φ)) used in the present invention. The S0 mode is called the fundamental-wave symmetrically longitudinal mode, the A0 mode is called the fundamental-wave anti-symmetric mode, and the S1 mode is called the primary symmetrically longitudinal mode. As shown, the reflector 1 and the reflector 2 are respectively designated 1302 and 1306, and the IDT 1, IDT 2, and IDT 3 are respectively designated 1303, 1304, and 1305. Designated 1307 is an X axis that is aligned with the direction of the propagation of the surface acoustic wave, and designated 1308 is an axis representing the magnitude of the displacement U(X).

The operational characteristics of the multi(three)-longitudinal-mode-coupled resonator type SAW filter of the present invention shown in FIG. 12 are discussed referring to FIG. 14 to FIG. 19.

FIG. 18 shows the operational transmission characteristics 1800, in a 50 Ω system, of the multi-longitudinal-mode-coupled resonator type SAW filter which has been measured with a load resistance of 50 Ω (1210 in FIG. 12). As shown in FIG. 18, the S0 mode results in an insertion loss of Sb(S0) (dB) at a frequency f(S0), the A0 mode results in an insertion loss of Sb(A0) (dB) at a frequency f(A0), and the S1 mode results in an insertion loess of Sb(S1) (dB) at a frequency f(S1). These respectively represent the magnitudes of the resonance amplitudes of the fundamental-wave symmetrically longitudinal mode S0, the fundamental-wave anti-symmetric mode A0, and the primary symmetrically longitudinal mode S1. The larger the resonance amplitude, the smaller the values of Sb(S0), Sb(A0) and Sb(S1). In the conventional art, the insertion losses Sb(S1) and Sb(A0) are larger than the insertion loss Sb(S0) as shown in FIG. 18, and the flatness of the passband of the filter is thus degraded. Furthermore, a frequency difference DF1=f(S0)−f(A0) and a frequency difference DF2=f(A0)−f(S1) are substantially different from each other, and filter impedances in the frequency regions DF1 and DF2 become different, causing ripples in amplitude characteristics.

The present invention has improved the flatness of the passband of the filter, by arranging the IDT 3, 1204, shown in FIG. 12, to control the vibration mode amplitudes of the S0, A0 and S1 modes.

FIG. 14 shows the variations in the insertion losses Sb(S0), Sb(A0) and Sb(S1) when the frequency rise rates IT1=IT2 of the IDT 1 (1202 in FIG. 12) is changed. The frequency rise rate IT3 of the IDT 3 is set to be 1.30. As shown in FIG. 14, a curve 1400 designates the insertion loss Sb(A0) in the A0 mode, a curve 1401 designates the insertion loss Sb(S0) in the S0 mode, and a curve 1402 designates the insertion loss Sb(S1) in the S1 mode. By setting the IDT 1 to be within a range from 0.9 to 1.2 (<IT3), the insertion loss Sb(S1) becomes close to the insertion losses Sb(S0) and Sb(A), and the flatness of the filter is thus improved. In the vicinity of point P with IT1=1.05, the relationship of the frequency difference DF1= the frequency difference DF2 holds, establishing an optimum condition free from ripples as already discussed. The frequency difference DF1 is designated 1403, and the frequency difference DF2 is designated 1404. The reason for this is thought to be the frequency rise rates of the IDT 1 and IDT 2 in the A0 (201) mode shown in FIG. 2 set to be lower than the frequency rise rate of the IDT 3. Such frequency rise rates decreases the energy trapping phenomenon in the S1 mode, shifting the resonance frequency closer to the S0 mode. The transmission characteristics thus obtained are represented by a curve 1900 as shown in FIG. 19. In this case, impedance matching is accomplished with the load resistance RL (1210 shown in FIG. 12) set to 300 Ω. As seen from FIG. 19, a 3 dB passband becomes flat.

Other setup conditions of the present invention are now discussed. In common setup conditions, the piezoelectric substrate (1200 in FIG. 12) is an ST cut, X propagating quartz crystal (the surface acoustic wave propagating in the X axis direction on a 30 to 40 degree rotary Y substrate is used), the finger cross width of the IDT is 30 to 40 wavelengths (λ), and the ratio H/λ of an electrode thickness H of aluminum to the wavelength λ (=2×PT1) of the surface acoustic wave falls within a range from 2% to 4%. Discussed referring to FIG. 15, FIG. 16, and FIG. 17 are other setup conditions in FIG. 12, namely the setting of the number of electrode finger pairs M1, M2, and M3 of the IDT 1, IDT 2, and IDT 3, and the width dimensions D1 and D2 of the cross bus bar conductor 1 and the cross bus bar conductor 2, respectively designated 1203 and 1205 in FIG. 12.

FIG. 15 shows characteristics 1500 indicating frequency difference Δf=(f(S0)−f(S1))/f(S0) (unit ppm) giving the filter passband width from f(S0) and f(S1), for the total number of pairs M(=M1+M2+M3). To obtain Δf to within a range of 1500 to 2500 ppm, typically required of a quartz crystal having good frequency-temperature characteristics, M within a range from 200 to 300 proves good. As shown, the curve 1501 represents the insertion loss Sb(A0) (dB) in the A0 mode, and offers substantially flat characteristics within the range of M.

FIG. 16 shows the setup for determining the number of pairs M1, M2, and M3 in each of the IDT 1, IDT 2, and IDT 3 (curves 1600 and 1601). The number of pairs is determined by M1=M2=M/DIV and M3=M−2×M1 where DIV is the number of divisions of the IDT. If the number of divisions DIV is within a range from 2.1 to 2.4, a passband width of 1800 to 2000 ppm results. The insertion loss in the A0 mode is within a range of 5±1 dB, which is sufficient characteristics (the curve 1601).

FIG. 17 shows the setup for determining the finger cross widths D1 and D2. As the basic setup, cross bus bar conductors connected to ground are respectively arranged between the IDT 1 and the IDT 3, and between the IDT 2 and the IDT 3 to generate single resonance modes (S0, A0, and S1 only), and the total length of the width of the cross bus bar conductor and spacings on both sides thereof is set to be nλ+(¼)λ or nλ+(¾)λ (n=0, 1, 2, . . . ) where the wavelength λ of the surface acoustic wave =2(PT1) or 2(PT2). If this setting is not followed, an unknown mode, assumed to be non-energy-trapped-type fundamental mode, takes place in the vicinity of 10000 ppm in a frequency region above the S0 mode. This is thought to be caused by the radiation wave in the upper transmission band that is one of the attributes of the substrate. Referring to FIG. 17, a passband width Δf having 1700 to 1900 ppm is assured if each of D1 and D2 falls within a range of 20 to 100 μm (corresponding to 2 to 3λ). In this case, the frequency rise rates are IT1 =IT2=1.0, and IT3=1.3, M=M1+M2+M3=256 pairs, and DIV=2.3, and the nominal frequency of the filter is within a range from 300 to 500 MHz. With the IT3 falling within a range from 0.9 to 1.5, including 1.3, substantially the same characteristics as those described above are obtained.

Finally, referring to FIG. 20 and FIG. 21, the construction commonly shared by the first and second embodiments of the present invention is now discussed. FIG. 20 shows the construction having weighted electrodes for suppressing transversely inharmonic modes in the above-described IDT 1 and IDT 2 (for instance, the interdigital transducers 102 and 106 shown in FIG. 1). The transversely inharmonic mode group is a natural mode group that is calculated using the above-referenced equation (2). In the multi-longitudinal-mode-coupled resonator type SAW filter of the present invention, the transversely inharmonic modes associated with the above-referenced S0, A0, and S1 modes need to be fully suppressed. To this end, one method is known in which the width of the IDT is weighted by a cosine function (cos (Y)) (Paper: W.H. Haydl et al.: "MULTIMODE SAW RESONATORS—A METHOD TO STUDY THE OPTIMUM RESONATOR DESIGN", Ultrasonic Symposium Proceedings 1976). The reason why this method suppresses the transversely inharmonic modes is that the modes have their own displacements mutually perpendicular thereto and a particular mode only is excited if an excitation area of an IDT proportional to the displacement of the particular mode is formed. The mutually perpendicular displacements mean that the integral of the product Y of two natural mode functions $\psi_i(Y)$ and $\psi_j(Y)$ is zero.

The width weighting technique of the IDT used in the present invention is a refined version of the conventional method, and as shown in FIG. 20, the following methods is employed.

The function Wc(X) (namely, Y(X) designated 2006 in FIG. 20, where both are related as W*(Y)=2Y(X)), setting the finger cross width of the IDT 1 (the first interdigital transducer) and the IDT 2 (the second interdigital transducer), is determined by equation Wc(X)=A cos ($k_0$Y) where A is an arbitrary constant, $k_0$ is a wave number of a fundamental wave mode S0 in the Y axis direction (2001), a displacement function $\psi_0$(Y) of the fundamental wave mode in a transversely inharmonic mode is $104_0(Y)=A\cos(k_0Y)$, $X_0$ represents the central position of the interdigital transducer in the X axis direction (a given position in the Y axis), and X and Y are related by the following equation $A\cos(k_0Y)$=absolute value of $(X-X_0)$. The dimension of the finger cross width Wc(X) of the IDT 1 (the first interdigital electrode) and the IDT 2 (the second interdigital electrode) is formed by separating a group of electrode fingers connected between positive and negative feeder conductors of the first interdigital transducer and the second interdigital transducer, by a spacing equal to or narrower than the ¼ wavelength (G in FIG. 20). In this way, an elastic displacement excited by the electric field created by a pair of positive and negative electrode fingers is not discontinued at the division and smoothly propagates in the Y axis direction, creating natural displacement state $\psi_0(Y)$. Perpendicularity is thus well assured between the modes, and the transversely inharmonic modes are well suppressed.

Another arrangement of the third interdigital transducer (IDT 3) of the present invention is now discussed, referring to FIG. 21. Referring to FIG. 21, 2100 and 2101 respectively designate the first interdigital transducer (IDT 1) and the second interdigital transducer (IDT 2). The region 2102 surrounded by a broken line is the third interdigital transducer (IDT 3). The region 2102 is divided into a portion 2104 and a portion 2105 by a division border portion 2103. Electrode fingers 2106 and 2107 and the like are alternately connected to and unconnected to any of feeder conductors 2108, 2109, 2113, and 2114.

The effect of the division border portion 2103 is first discussed. Designated 2110 in FIG. 21 is an X axis indicating the direction of the propagation of the surface acoustic wave, and designated 2111 is an axis indicating the relative value of a displacement quantity U(X) in a longitudinal mode. A curve 2112 represents an envelope of a displacement U(X) (displacement function v(X)=U(X), and U(X) expressed by cos (kX)) of the amplitude of the fundamental-wave anti-symmetric mode A0, one of the vibration modes of the present invention. The displacement 2112 is reversed at the division border portion 2103 with the charge occurring in the electrode fingers on the same polarity side reversed there. Without the divisional line, Joule heat is generated, and energy loss takes place. A resistance component in resonance develops, increasing the insertion loss in the A0 mode. When the energy loss is marginal, in other words, the number of pairs M3 of the electrode fingers of the third interdigital transducer is small, the electrode finger groups 2106 and 2107 may be all connected, on both sides thereof, to the feeder conductors 2108, 2109, 2113, and 2114.

It is easily contemplated that the above discussion holds in the multi-longitudinal-mode-coupled resonator type SAW filters constructed of a material other than quartz crystal and that the above discussion also holds in a frequency dropped type substrate if the direction of the frequency potential axis is inverted. This may be easily understood by analogy with the carrier for current carrying function in a semiconductor substrate in which the carrier (corresponding to the surface acoustic wave) is either electrons (minus charges) (corresponding to the upper transmission band) or holes (positive charges) (corresponding to the lower transmission band).

In accordance with the present invention, the frequency upward type, energy trapped SAW resonator is constructed, the IDT is divided into the three IDTs, the first IDT 1 is used as an input terminal pair, the second IDT 2 is used as an output terminal pair, and the third IDT 3 is arranged between the first and second IDTs to control the amplitude of the vibration displacement of the two longitudinal modes S0 and A0 or the three longitudinal modes S0, A0, and S1, forming the filter. By changing the electrode period length of the IDT 1, IDT 2, and IDT 3 to optimize the frequency potential, the resonance amplitude strengths of S0 an A0, or S0, A0, and S1 are equalized, and the passband transmission characteristics of the multi-longitudinal-mode-coupled resonator type SAW filter are made flat. As a result, a relatively wide bandwidth of 1000 to 1500 ppm is realized in the multi-longitudinal-mode-coupled resonator type SAW filter having excellent insertion loss and out-of-band attenuation properties, using a small substrate, such as a quartz crystal, having excellent frequency-temperature characteristics and a small electromechanical coefficient. With these excellent characteristics, the multi-longitudinal-mode-coupled resonator type SAW filter is expected to be greatly advantageous in the application thereof.

INDUSTRIAL APPLICABILITY

As mobile communication currently becomes widespread in use, the congestion of radio waves is increased, and noise in free-space transmission path is also increased. Under this circumstance, specific narrow-band radio equipment working in a small or extremely small power is continuously employed.

With the multi-longitudinal-mode-coupled resonator type SAW filter of the present invention used as a bandpass filter in the receiver of the radio equipment, a high reliability operation and an improved S/N ratio are achieved in the equipment.

What is claimed is:

1. A multi-longitudinal-mode-coupled resonator type SAW filter comprising, on a piezoelectric substrate:

a first interdigital transducer that excites a surface acoustic wave;

a second interdigital transducer that receives the surface acoustic wave excited by the first interdigital transducer;

a third interdigital transducer interposed between the first interdigital transducer and the second interdigital transducer that controls an amplitude of the excited surface acoustic wave; and a pair of reflectors arranged with the first interdigital transducer, the second interdigital transducer and the third interdigital transducer interposed therebetween in a direction of propagation of the surface acoustic wave, the reflectors, the first interdigital transducer, the second interdigital transducer and the third interdigital transducer being formed of parallel metallic conductors periodically arranged on the piezoelectric substrate, a distance between a reflector and a closest parallel conductor of the first interdigital transducer being set to be equal to a width of a spacing of the first interdigital transducer with one period length thereof having alternating spacing and line, a distance between a reflector and a closest parallel conductor of the second interdigital transducer being set to be equal to a width of a spacing of the second interdigital transducer with one period length thereof having alternating spacing and line, each period length PT1 of the parallel conductors of the first interdigital transducer and period length PT2 (=PT1) of the parallel conductors of the second interdigital transducer being set to be shorter than a period length PT3 of the parallel conductors of the third interdigital transducer (PT3>PT1, PT2), each of the period length PT1 and the period length PT2 being set to be shorter than a period length PR of the parallel conductors of the reflectors, the first interdigital transducer, the second interdigital transducer and the third interdigital transducer having a total reflective coefficient $\Gamma$ set to be $10 > \Gamma > 0.8$, and being energy trapped type resonators, and a two-longitudinal-mode-coupled resonator filter being formed of a fundamental wave symmetrically longitudinal mode S0 having a displacement amplitude function generally symmetrical with respect to a central position in the direction of propagation X in which the surface acoustic wave is standing, and a fundamental wave anti-symmetric mode A0 having a displacement amplitude function generally anti-symmetrical with respect to the central position.

2. The multi-longitudinal-mode-coupled resonator type SAW filter according to claim 1, (PR−PT1)/PR=$1\epsilon$ to $1.7\epsilon$ and (PR−PT3)/PR=0 to $0.8\epsilon$ holding, where $\epsilon$ is a deviation $(f_{RO} - f_{TO})/f_{RO}$ between a center frequency $f_{RO}$ and a frequency $f_{TO}$ where in a setting of the period length PT1, the period length PT2, and the period length PT3, $f_{RO}$ is a reflective wave center frequency of a reflector, and $f_{TO}$ is a frequency at which the first interdigital transducer, the second interdigital transducer, and the third interdigital transducer, when considered as a unit, exhibit a maximum reflective conductance G.

3. The multi-longitudinal-mode-coupled resonator type SAW filter according to claim 1, a sum of pairs of electrode fingers M=M1+M2+M3 falling within a range from 140 to 180, where M1 is a number of pairs of electrode fingers of the first interdigital transducer, M2 is a number of pairs of electrode fingers of the second interdigital transducer, and M3 is a number of pairs of electrode fingers of the third interdigital transducer, M1 being set to be equal to M2, and DIV falling within a range from 2.1 to 2.4 where DIV is defined as M1=M/DIV.

4. The multi-longitudinal-mode-coupled resonator type SAW filter according to claim 1, a first cross bus bar conductor and a second cross bus bar conductor, each connected to ground potential, being respectively arranged between the first interdigital transducer and the second interdigital transducer, and between the second interdigital transducer and the third interdigital transducer, a total width D1 of the first cross bus bar conductor and of the spacings on both sides of the first cross bus bar conductor being $n\lambda + (\frac{1}{4})\lambda$ or $n\lambda + (\frac{3}{4})\lambda$ (n=0, 1, 2, ... ) where $\lambda$ represents a wavelength of the surface acoustic wave, a total width D2 of the second cross bus bar conductor and of spacings on both sides of the second cross bus bar conductor being $n\lambda + (\frac{1}{4})\lambda$ or $n\lambda + (\frac{3}{4})\lambda$ (n=0, 1, 2, ... ) where $\lambda$ represents the wavelength of the surface acoustic wave, and each of D1 and D2 being within a range of 20 to 100 $\mu$m or within a range of $2\lambda$ to $3\lambda$.

5. The multi-longitudinal-mode-coupled resonator type SAW filter according to claim 1, a function Wc(X), setting a finger cross width of the first interdigital transducer and the second interdigital transducer, being determined by an equation Wc(X)=A cos ($k_0$Y), where X and Y are related by an equation A cos ($k_0$Y)=absolute value of (X−$X_0$), where A is an arbitrary constant, $k_0$ is a wave number of a fundamental wave mode, a displacement function $\psi_0$(Y) of the fundamental wave mode in a transversely inharmonic mode is $\psi_0$(Y)=A cos ($k_0$Y), and $X_0$ represents a central position of the first IDT or the second IDT in an X axis direction.

6. The multi-longitudinal-mode-coupled resonator type SAW filter according to claim 5, the finger cross width Wc(X) of the first interdigital transducer and the second interdigital transducer being formed by separating a group of electrode fingers connected between positive feeder conductors and negative feeder conductors of the first interdigital transducer and the second interdigital transducer, by a spacing equal to or narrower than a $\frac{1}{4}$ wavelength of the surface acoustic wave.

7. The multi-longitudinal-mode-coupled resonator type SAW filter according to claim 1, the third interdigital transducer having a pattern that is divided and separated at a central position in a direction of propagation of X.

8. The multi-longitudinal-mode-coupled resonator type SAW filter according to claim 1, the third interdigital transducer having positive electrode fingers and negative electrode fingers, one of which being connected to neither of feeder conductors on both sides thereof.

9. The multi-longitudinal-mode-coupled resonator type SAW filter according to claim 1, the piezoelectric substrate being an ST cut crystal.

10. A multi-longitudinal-mode-coupled resonator type SAW filter comprising, on a piezoelectric substrate:

a first interdigital transducer that excites a surface acoustic wave;

a second interdigital transducer that receives the surface acoustic wave excited by the first interdigital transducer;

a third interdigital transducer interposed between the first interdigital transducer and the second interdigital transducer that controls an amplitude of the excited surface acoustic wave; and a pair of reflectors arranged with the first interdigital transducer, the second interdigital transducer and the third interdigital transducer interposed therebetween in a direction of the propagation of the surface acoustic wave, in a longitudinal direction X, the reflectors, the first interdigital transducer, the second interdigital transducer and the third interdigital transducer being formed of parallel metallic conductors that are periodically arranged on the piezoelectric substrate, a distance between a reflector and a closest parallel conductor of the first interdigital transducer being set to be equal to a width of a spacing of the first interdigital transducer with one period length thereof having alternating spacing and line, a distance between a reflector and a closest parallel conductor of the second interdigital transducer being set to be equal to a width of a spacing of the second interdigital transducer with one period length thereof having alternating spacing and line, each period length PT1 of the parallel conductors of the first interdigital transducer and period length PT2 (=PT1) of the parallel conductors of the second interdigital transducer being set to be longer than a period length PT3 of the parallel conductors of the third interdigital transducer (PT3<PT1, PT2), each of the period length PT1 and the period length PT2 being set to be shorter than a period length PR of the parallel conductors of the reflectors, the first interdigital transducer, the second interdigital transducer and the third interdigital transducer having a total reflective coefficient $\Gamma$ set to be $10 > \Gamma > 0.8$, and being energy trapped type resonators, and a three-longitudinal-mode-coupled resonator filter being formed of a fundamental wave symmetrically longitudinal mode S0 having a displacement amplitude function generally symmetrical with respect to a central position in the direction of propagation X in which the surface acoustic wave is standing, a fundamental wave anti-symmetric mode A0 having a displacement amplitude function generally anti-symmetrical with respect to the central position, and a primary symmetrically longitudinal mode S1 having two nodes in a vibration displacement amplitude and is generally symmetrical with respect to the central position.

11. The multi-longitudinal-mode-coupled resonator type SAW filter according to claim 10, (PR−PT1)/PR=0.7$\epsilon$ to 1.2$\epsilon$ and (PR−PT3)/PR=0.9$\epsilon$ to 1.5$\epsilon$ holding where $\epsilon$ is a, deviation ($f_{RO}$−$f_{TO}$)/$f_{RO}$ between a center frequency $f_{RO}$ and a frequency $f_{TO}$ where in a setting of the period length PT1, the period length PT2, and the period length PT3, $f_{RO}$ is a reflective wave center frequency of a reflector, and $f_{TO}$ is a frequency at which the first interdigital transducer, the second interdigital transducer, and the third interdigital transducer, when considered as a unit, exhibit a maximum reflective conductance G.

12. The multi-longitudinal-mode-coupled resonator type SAW filter according to claim 10, a sum of pairs of electrode fingers M=M1+M2+M3 falling within a range from 200 to 300, where M1 is a number of pairs of electrode fingers of the first interdigital transducer, M2 is a number of pairs of electrode fingers of the second interdigital transducer M2, and M3 is a number of pairs of electrode fingers of the third interdigital transducer, M1 being set to be equal to M2, and DIV falling within a range from 2.1 to 2.4 where DIV is defined as M1=M/DIV.

13. The multi-longitudinal-mode-coupled resonator type SAW filter according to claim 10, a first cross bus bar conductor and a second cross bus bar conductor, each connected to ground potential, being respectively arranged between the first interdigital transducer and the second interdigital transducer, and between the second interdigital transducer and the third interdigital transducer, a total width D1 of the first cross bus bar conductor and of spacings on both sides of the first cross bus bar conductor being n$\lambda$+($\frac{1}{4}$)$\lambda$ or n$\lambda$+($\frac{3}{4}$)$\lambda$ (n=0, 1, 2, . . . ) where $\lambda$ represents a wavelength of the surface acoustic wave, a total width D2 of the second cross bus bar conductor and of spacings on both sides of the second cross bus bar conductor being n$\lambda$+($\frac{1}{4}$)$\lambda$ or n$\lambda$+($\frac{3}{4}$)$\lambda$ (n=0, 1, 2, . . . ) where $\lambda$ represents the wavelength of the surface acoustic wave, and each of D1 and D2 being within a range of 20 to 100 $\mu$m or within a range of 2$\lambda$ to 3$\lambda$.

* * * * *